US012652766B2

(12) United States Patent
Cho et al.

(10) Patent No.: US 12,652,766 B2
(45) Date of Patent: Jun. 9, 2026

(54) ELECTRONIC DEVICE COMPRISING FLEXIBLE DISPLAY

(71) Applicant: Samsung Electronics Co., Ltd., Suwon-si (KR)

(72) Inventors: Baekeun Cho, Suwon-si (KR); Myunghoon Kwak, Suwon-si (KR); Bohyeon Kim, Suwon-si (KR); Hoyoung Jeong, Suwon-si (KR); Youngmin Ji, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 215 days.

(21) Appl. No.: 18/582,038

(22) Filed: Feb. 20, 2024

(65) Prior Publication Data

US 2024/0196550 A1     Jun. 13, 2024

Related U.S. Application Data

(63) Continuation of application No. PCT/KR2022/012515, filed on Aug. 22, 2022.

(30) Foreign Application Priority Data

Aug. 23, 2021    (KR) ........................ 10-2021-0111166
Nov. 11, 2021    (KR) ........................ 10-2021-0154683

(51) Int. Cl.
H05K 5/02         (2006.01)
H05K 7/20         (2006.01)

(52) U.S. Cl.
CPC ....... H05K 5/0217 (2013.01); H05K 7/20963 (2013.01)

(58) Field of Classification Search
CPC ........ G06F 1/1652; G06F 1/1624; G06F 1/16; G06F 1/1637; G06F 1/1656;
(Continued)

(56) References Cited

U.S. PATENT DOCUMENTS 8,711,566 B2 *    4/2014   O'Brien ................ G06F 1/1652
                                                         361/724
9,557,771 B2      1/2017   Park et al.
(Continued)

FOREIGN PATENT DOCUMENTS

CN         212850572 U      3/2021
CN         109920329 B      4/2021
(Continued)

OTHER PUBLICATIONS

International Search Report with Written Opinion and English translation dated Dec. 21, 2021; International Patent Application No. PCT/KR2022/012515.

(Continued)

*Primary Examiner* — Michael A Matey
(74) *Attorney, Agent, or Firm* — Jefferson IP Law, LLP

(57)                    ABSTRACT

An electronic device is provided including a first housing, a second housing that slides relative to the first housing, a flexible display configured such that a size of a region exposed on a front side of the electronic device is changed in response to a sliding motion of the second housing relative to the first housing, a heat radiating sheet disposed on at least a portion of a rear surface of the flexible display, and a flexible display support member disposed on a portion of a rear surface of the heat radiating sheet to support a portion of the flexible display. The flexible display support member includes a plurality of support bars that extend in a direction perpendicular to a sliding direction of the second housing. The plurality of support bars are spaced apart. The (Continued)

heat radiating sheet includes a plurality of folding portions, and at least portions of the heat radiating sheet are located in spaces separating the plurality of support bars.

20 Claims, 19 Drawing Sheets

(58) Field of Classification Search
CPC ........ G06F 1/1641; G06F 1/1616; G06F 1/20; H04M 1/0268; H04M 1/0237; H04M 1/0235; H04M 1/0216; H04M 2201/38; G09F 9/301; H05K 7/20954; H05K 7/20963; H05K 7/20472; H05K 7/20972; H05K 1/02; H05K 2201/10128; H05K 7/20409; H05K 7/205; H05K 9/0054; H05K 9/0084; H05K 5/0217
See application file for complete search history.

(56) References Cited

U.S. PATENT DOCUMENTS

| | | | |
|---|---|---|---|
| 9,829,924 B2 | 11/2017 | Shin et al. | |
| 9,877,384 B2 | 1/2018 | Lee et al. | |
| 10,551,880 B1 | 2/2020 | Al et al. | |
| 10,564,676 B2 | 2/2020 | Kwon et al. | |
| 10,750,625 B2 | 8/2020 | Park | |
| 10,972,592 B2 | 4/2021 | Song et al. | |
| 11,058,018 B1 | 7/2021 | Yoon et al. | |
| 11,165,897 B2 | 11/2021 | Song et al. | |
| 11,181,955 B2 | 11/2021 | Kwon et al. | |
| 11,252,826 B2 | 2/2022 | Park et al. | |
| 11,385,686 B2 | 7/2022 | Al et al. | |
| 11,470,729 B2 | 10/2022 | Kim et al. | |
| 11,581,499 B2 | 2/2023 | Jang | |
| 11,594,708 B2 | 2/2023 | Lee et al. | |
| 11,815,948 B2 | 11/2023 | Song et al. | |
| 12,019,474 B2 | 6/2024 | Song et al. | |
| 12,088,744 B2 * | 9/2024 | Lee | H04M 1/0237 |
| 12,336,119 B2 | 6/2025 | Park et al. | |
| 2015/0362791 A1 | 12/2015 | Kakuda et al. | |
| 2016/0070304 A1 | 3/2016 | Shin et al. | |
| 2016/0324014 A1 | 11/2016 | Lee et al. | |
| 2019/0138058 A1 | 5/2019 | Kwon et al. | |
| 2020/0241610 A1 | 7/2020 | Kwon et al. | |
| 2020/0245501 A1 | 7/2020 | Wu et al. | |
| 2020/0383219 A1 * | 12/2020 | Hale | G06F 1/1641 |
| 2021/0352813 A1 * | 11/2021 | Cho | H05K 5/0226 |
| 2022/0019264 A1 * | 1/2022 | Cho | G06F 1/1652 |
| 2022/0083110 A1 | 3/2022 | Kwon et al. | |
| 2022/0117100 A1 | 4/2022 | Yoon et al. | |
| 2022/0338381 A1 | 10/2022 | Wu et al. | |
| 2022/0342448 A1 * | 10/2022 | Shin | G06F 1/1624 |
| 2022/0342458 A1 | 10/2022 | Al et al. | |
| 2023/0018137 A1 | 1/2023 | Yuan et al. | |

FOREIGN PATENT DOCUMENTS

| | | |
|---|---|---|
| KR | 10-1587489 B1 | 1/2016 |
| KR | 10-2016-0029543 A | 3/2016 |
| KR | 10-2016-0129947 A | 11/2016 |
| KR | 10-2019-0051541 A | 5/2019 |
| KR | 10-2019-0143029 A | 12/2019 |
| KR | 10-2020-0027760 A | 3/2020 |
| KR | 10-2020-0036409 A | 4/2020 |
| KR | 10-2020-0064376 A | 6/2020 |
| KR | 10-2020-0093261 A | 8/2020 |
| KR | 10-2020-0115773 A | 10/2020 |
| KR | 10-2020-0117741 A | 10/2020 |
| KR | 10-2020-0124483 A | 11/2020 |
| KR | 10-2021-0022790 A | 3/2021 |
| KR | 10-2021-0074254 A | 6/2021 |
| KR | 10-2274481 B1 | 7/2021 |
| WO | 2021/132775 A1 | 7/2021 |

OTHER PUBLICATIONS

Extended European Search Report dated Oct. 28, 2024; European Appln. No. 22861657.9-1218 / 4375792 PCT/KR2022012515.
Korean Office Action with English translation dated Oct. 24, 2025; Korean Appin No. 10-2021-0154683.
Indian Office Action dated Nov. 14, 2025; Indian Appln. No. 202417022063.
European Office Action dated Mar. 12, 2026, issued in European Application No. 22861657.9.

* cited by examiner

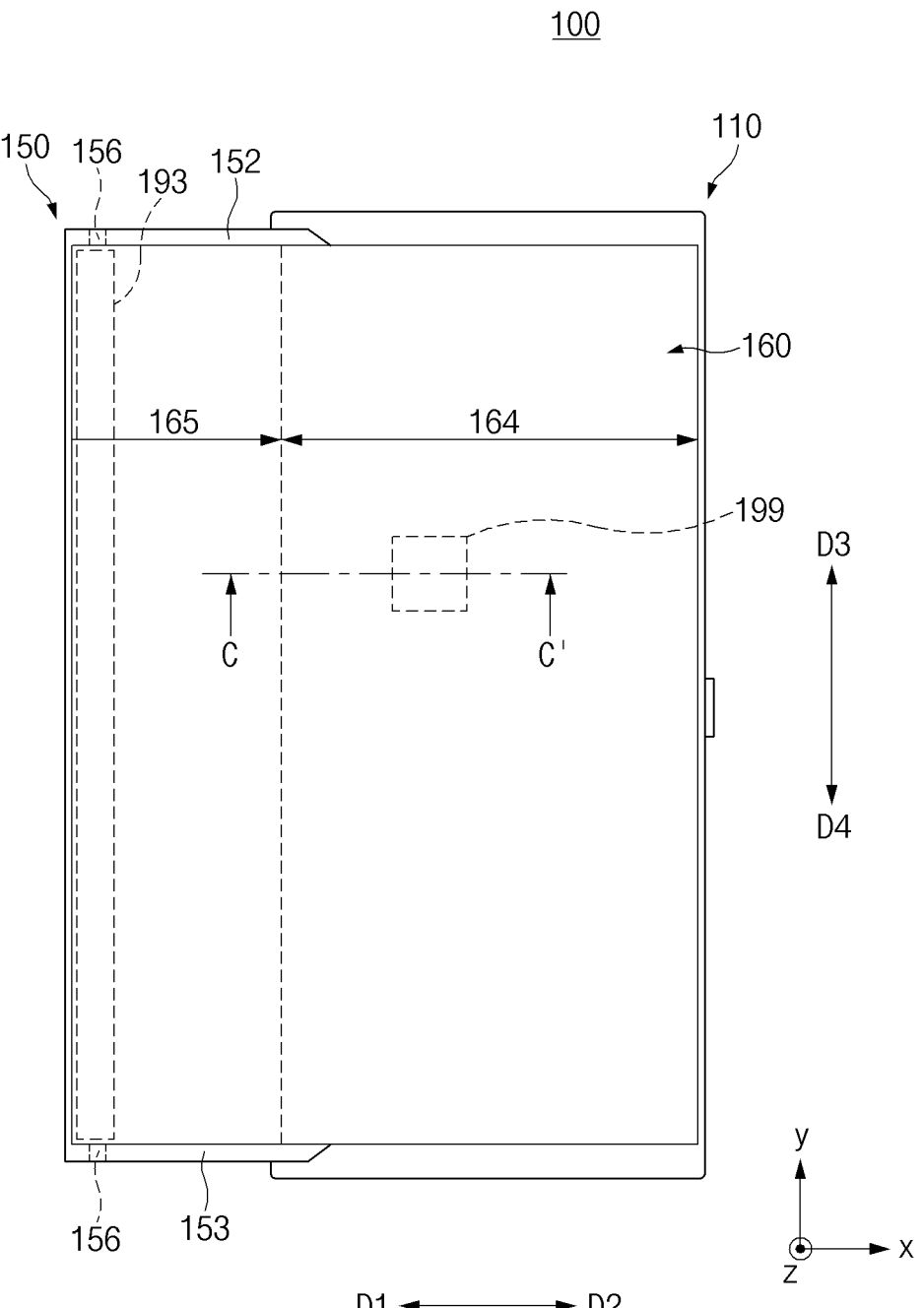
F I G . 11

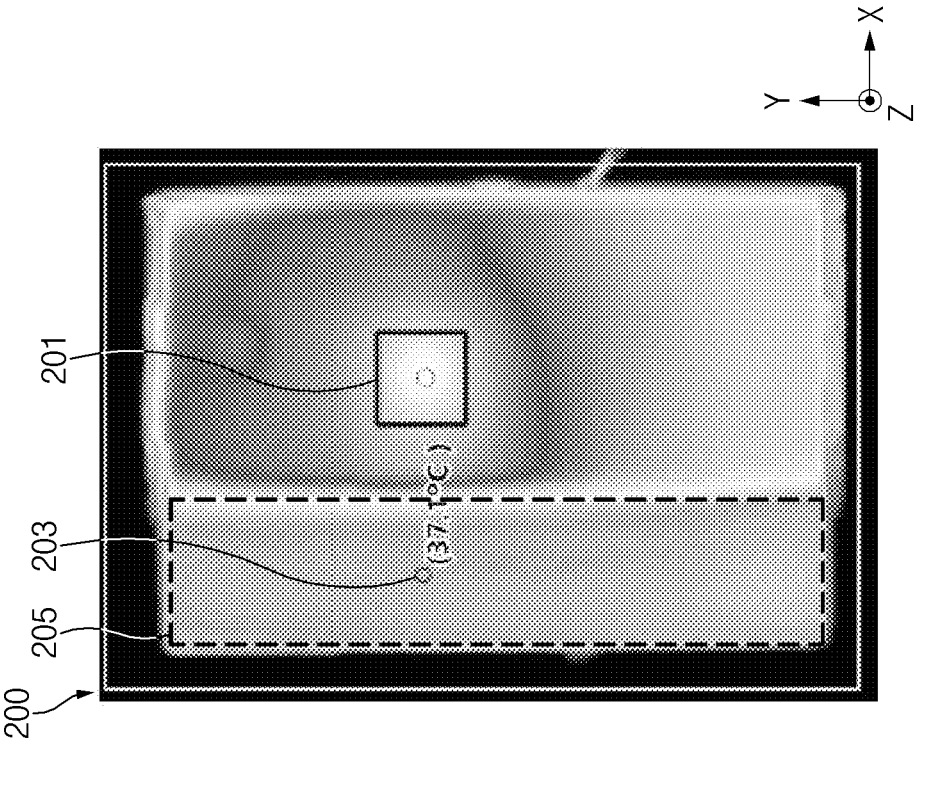
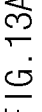
FIG. 13A
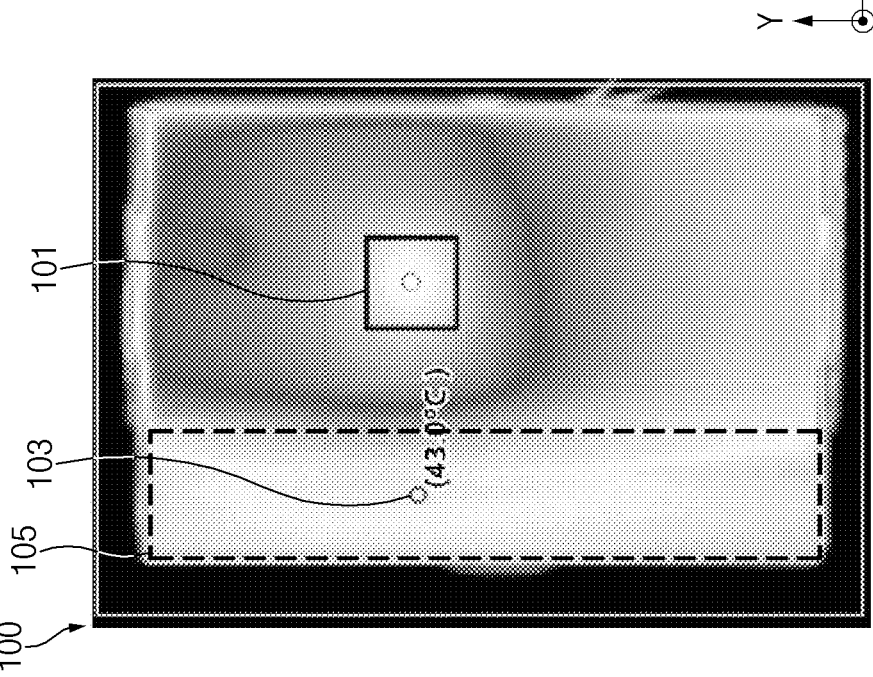

ELECTRONIC DEVICE COMPRISING FLEXIBLE DISPLAY

CROSS-REFERENCE TO RELATED APPLICATION(S)

This application is a continuation application, claiming priority under § 365(c), of an International application No. PCT/KR2022/012515, filed on Aug. 22, 2022, which is based on and claims the benefit of a Korean patent application number 10-2021-0111166, filed on Aug. 23, 2021, in the Korean Intellectual Property Office, and of a Korean patent application number 10-2021-0154683, filed on Nov. 11, 2021, in the Korean Intellectual Property Office, the disclosure of each of which is incorporated by reference herein in its entirety.

BACKGROUND

1. Field

The disclosure relates to an electronic device including a flexible display.

2. Description of Related Art

An electronic device may include a flexible display. The electronic device may expand a display area visually exposed on the exterior of the electronic device. For example, in the electronic device, the flexible display may be disposed in a curved, foldable, or rollable form.

The above information is presented as background information only to assist with an understanding of the disclosure. No determination has been made, and no assertion is made, as to whether any of the above might be applicable as prior art with regard to the disclosure.

SUMMARY

To effectively radiate heat generated when the electronic device is driven, the electronic device may include a heat radiating sheet (e.g., a graphite sheet or a copper sheet) having high thermal conductivity on the rear surface of the display and may be configured to diffuse heat generated from a heat generating source through the front display.

A flexible display included in a slidable or rollable electronic device may include a rolling section (or, a rollable portion). When a heat radiating sheet is disposed on the rear surface of the flexible display including the rolling section, the heat radiating sheet may be broken and/or stripped due to stress consistently applied to the heat radiating sheet by a motion of the rolling section. When the heat radiating sheet is broken and/or stripped, diffusion of heat may not be effectively performed.

Aspects of the disclosure are to address at least the above-mentioned problems and/or disadvantages and to provide at least the advantages described below. Accordingly, an aspect of the disclosure is to provide a slidable or rollable electronic device having heat radiating performance improved by a heat radiating sheet disposed between a flexible display and a multi-bar module and having a corrugated structure.

Additional aspects will be set forth in part in the description which follows and, in part, will be apparent from the description, or may be learned by practice of the presented embodiments.

In accordance with an aspect of the disclosure, an electronic device is provided. The electronic device includes a first housing, a second housing disposed to slide relative to the first housing, a flexible display configured such that a size of a region exposed on a front side of the electronic device is changed in response to a sliding motion of the second housing relative to the first housing, a heat radiating sheet disposed on at least a portion of a rear surface of the flexible display, and a flexible display support member disposed on a portion of a rear surface of the heat radiating sheet to support a portion of the flexible display. The flexible display support member includes a plurality of support bars that extend in a direction perpendicular to a sliding direction of the second housing. The plurality of support bars are spaced apart from each other by a gap. The heat radiating sheet includes a plurality of folding portions, and at least portions of the heat radiating sheet are located in spaces separating the plurality of support bars.

In accordance with another aspect of the disclosure, an electronic device is provided. The electronic device includes a housing having an opening formed on one side thereof, a roller coupled to an inside of the housing so as to be rotatable, and a flexible display module that is connected to the roller at one end portion thereof and rolled around or unrolled from the roller depending on a direction of rotation of the roller and that moves into or out of the housing through the opening. The flexible display module includes a flexible display, a heat radiating sheet disposed on at least a portion of a rear surface of the flexible display, and a flexible display support member disposed on at least a portion of a rear surface of the heat radiating sheet to support the flexible display. The flexible display support member includes a plurality of support bars that extend in a direction substantially parallel to the roller. The plurality of support bars are spaced apart from each other by a gap. The heat radiating sheet includes a plurality of attachment portions to which the plurality of support bars and the rear surface of the flexible display are attached and a plurality of folding portions disposed between the plurality of attachment portions adjacent to each other. The plurality of folding portions are configured such that at least portions thereof are located in spaces separating the plurality of support bars.

The electronic device according to the various embodiments of the disclosure may include the heat radiating sheet extending to an expanded portion of the electronic device and thus may improve heat radiating performance.

Furthermore, in the electronic device according to the various embodiments of the disclosure, the corrugated structure corresponding to the plurality of support bars of the flexible display support member (e.g., a multi-bar module) may be formed in the heat radiating sheet, and thus the heat radiating sheet may be prevented from being broken and/or stripped due to deformation of the electronic device.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

3

Figure 1:
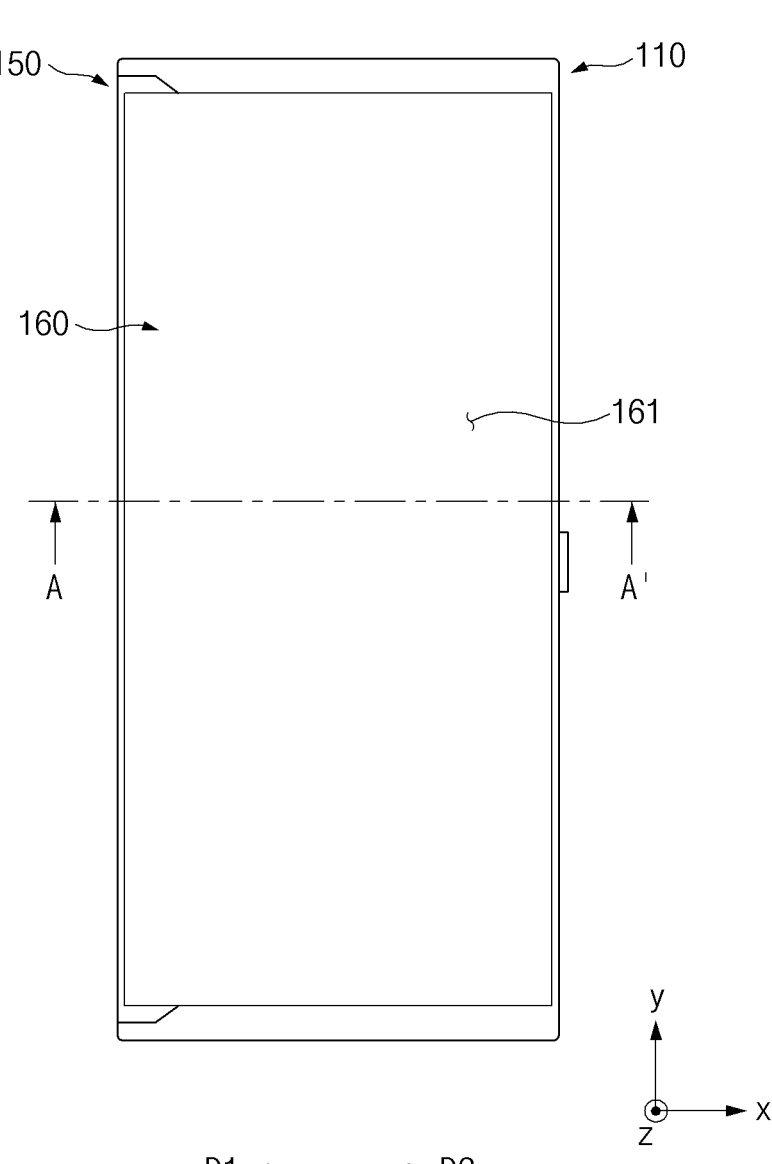
Figure 2:
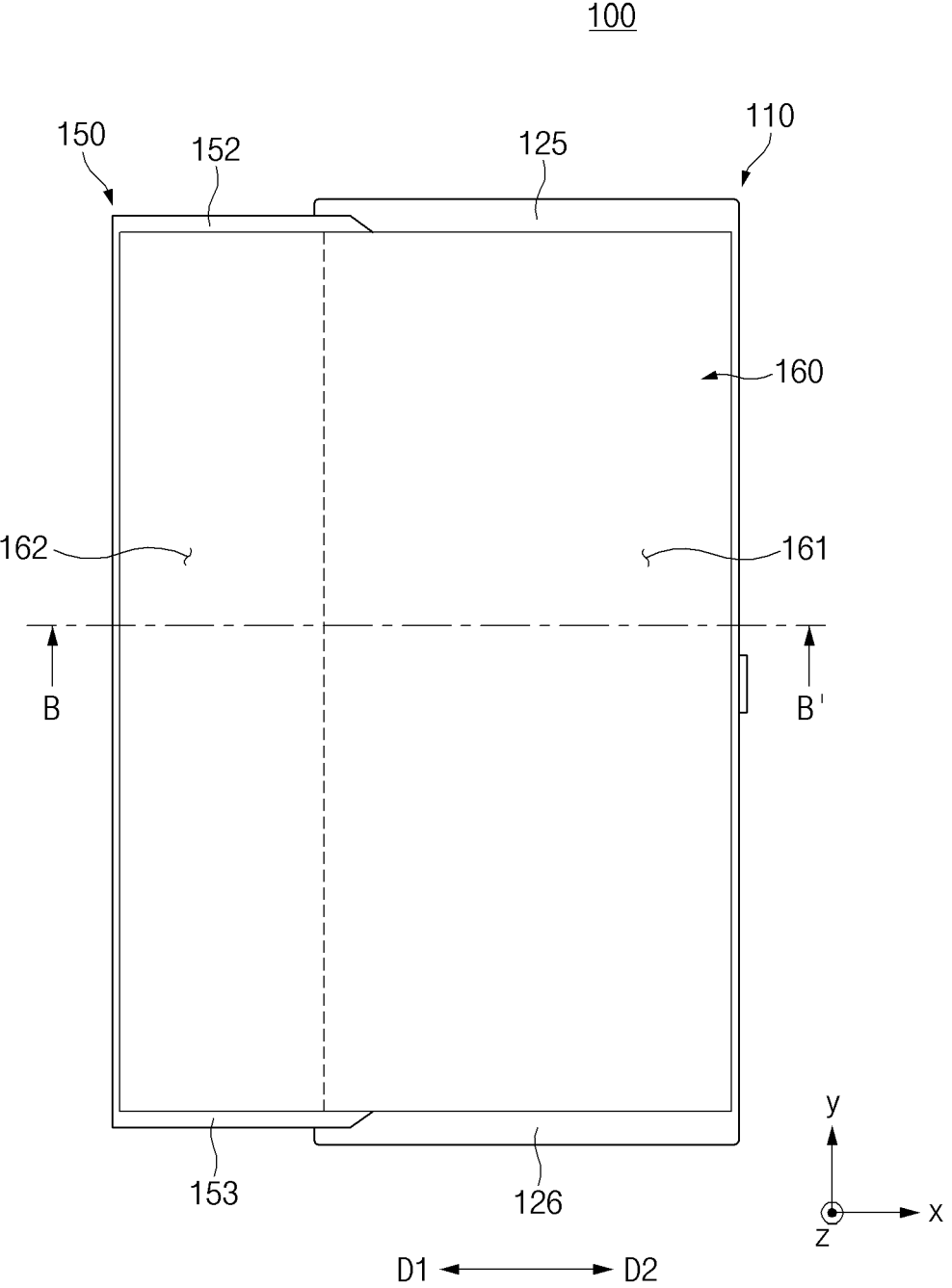
Figure 3:
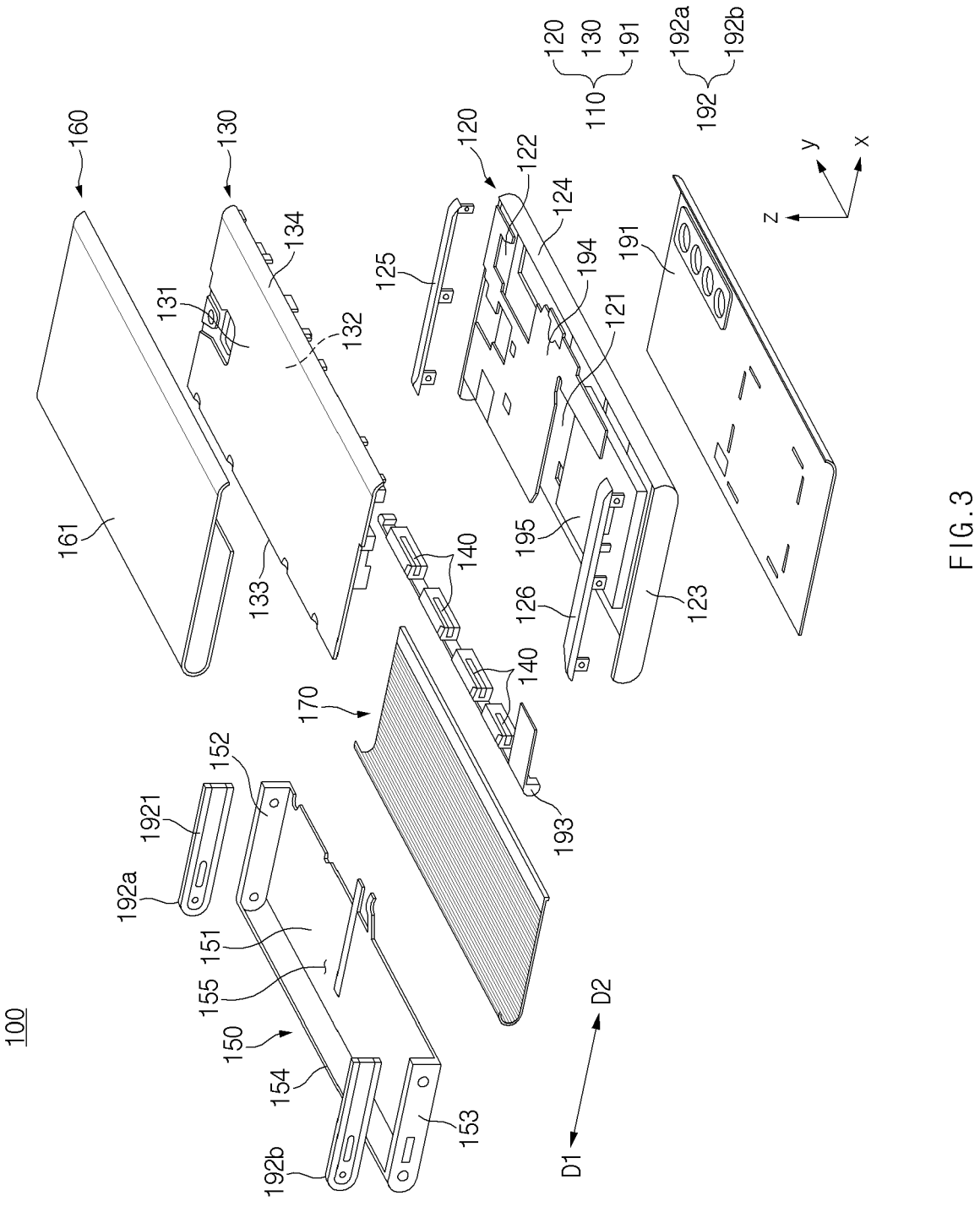
Figures 4A, 4B:
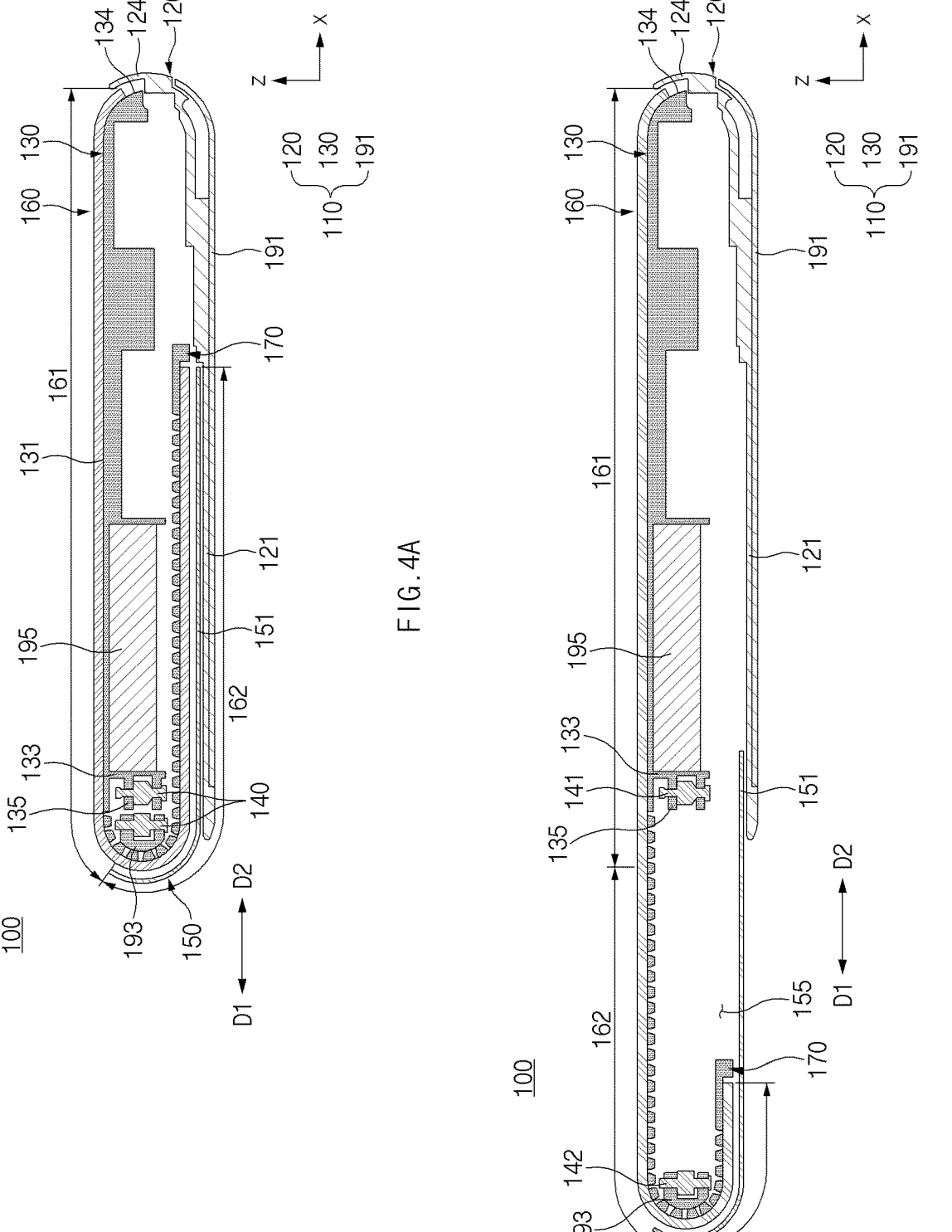
Figure 5A:
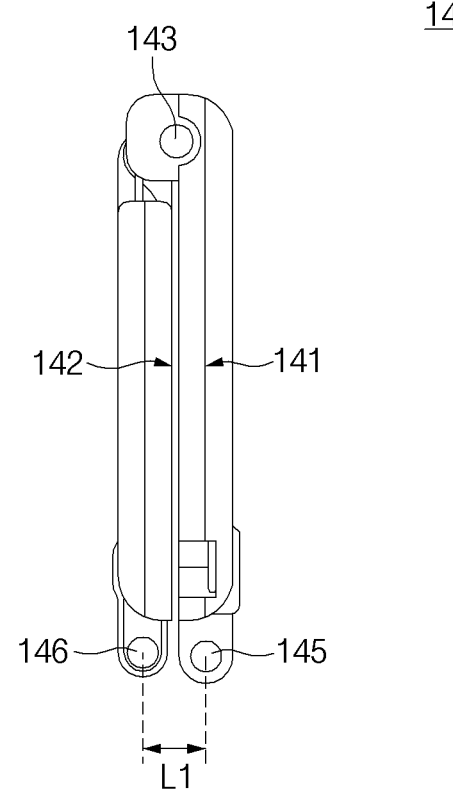
Figure 5B:
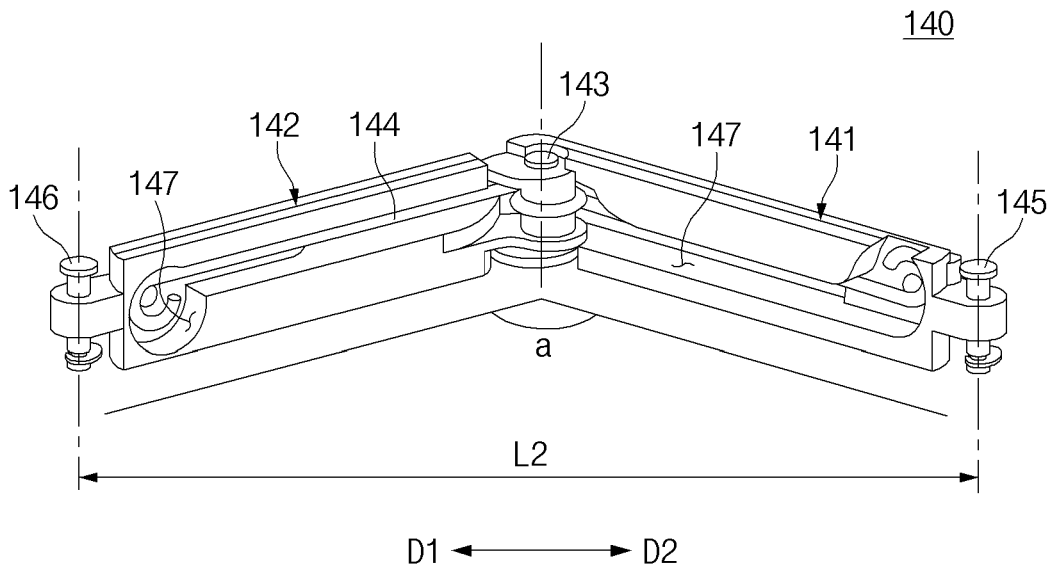
Figure 6A:
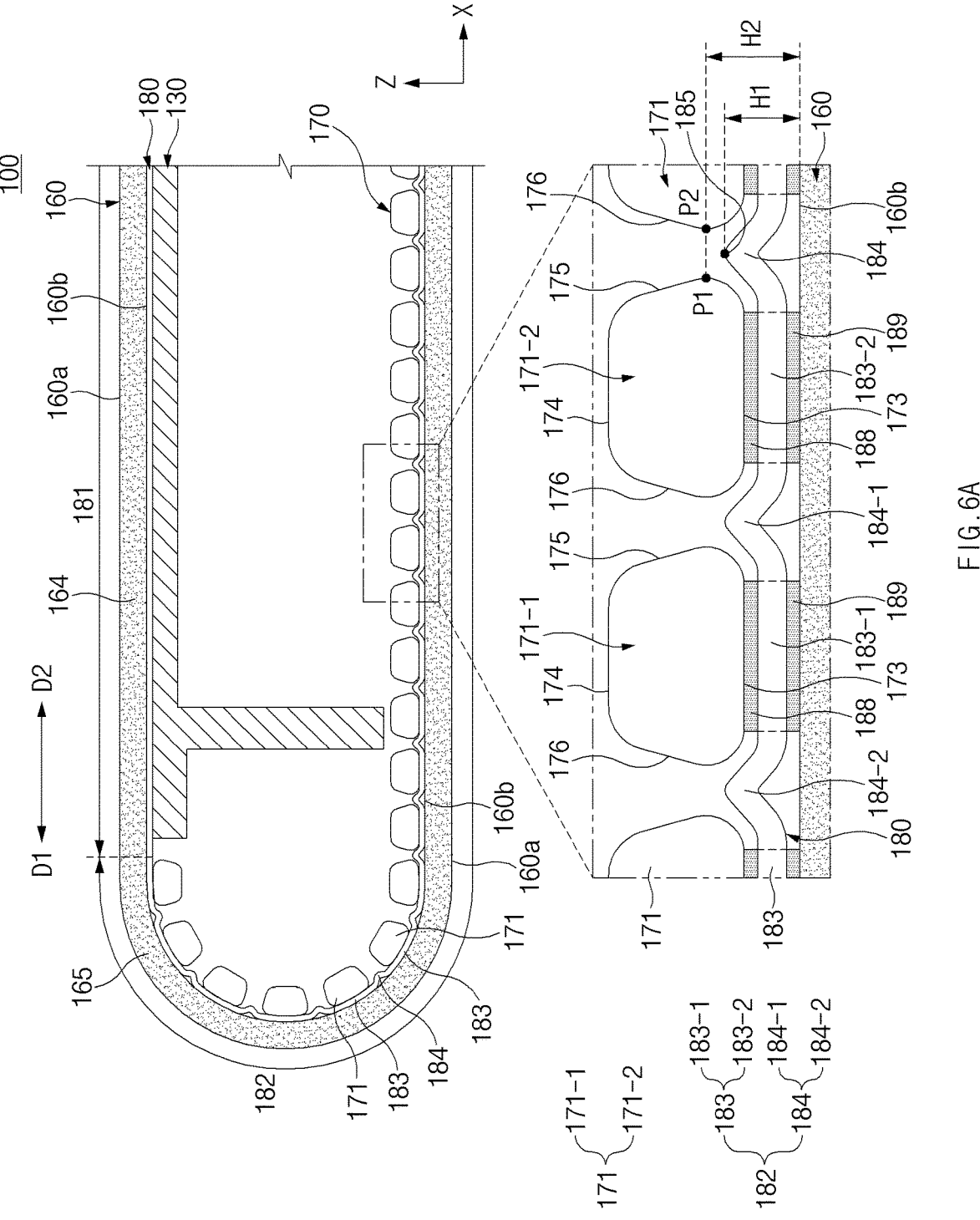
Figure 6B:
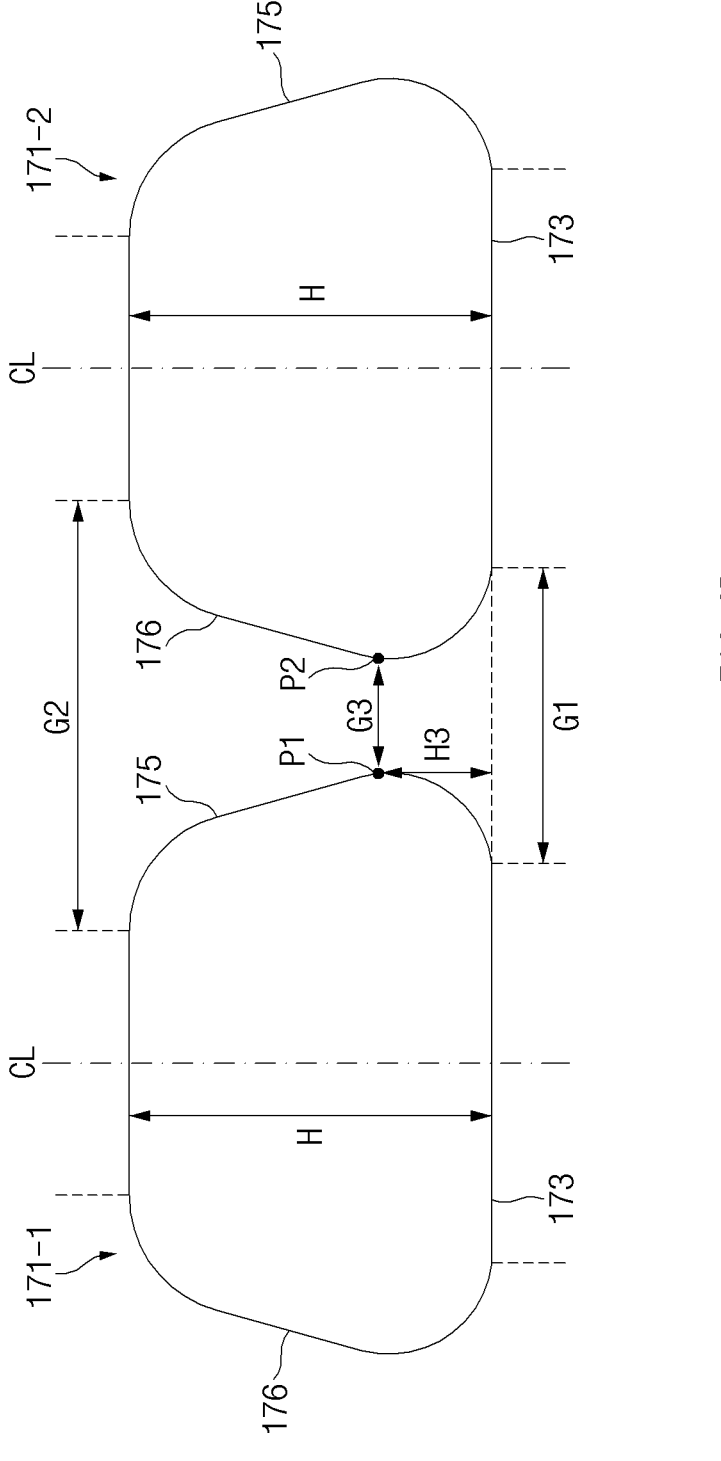
Figure 7:
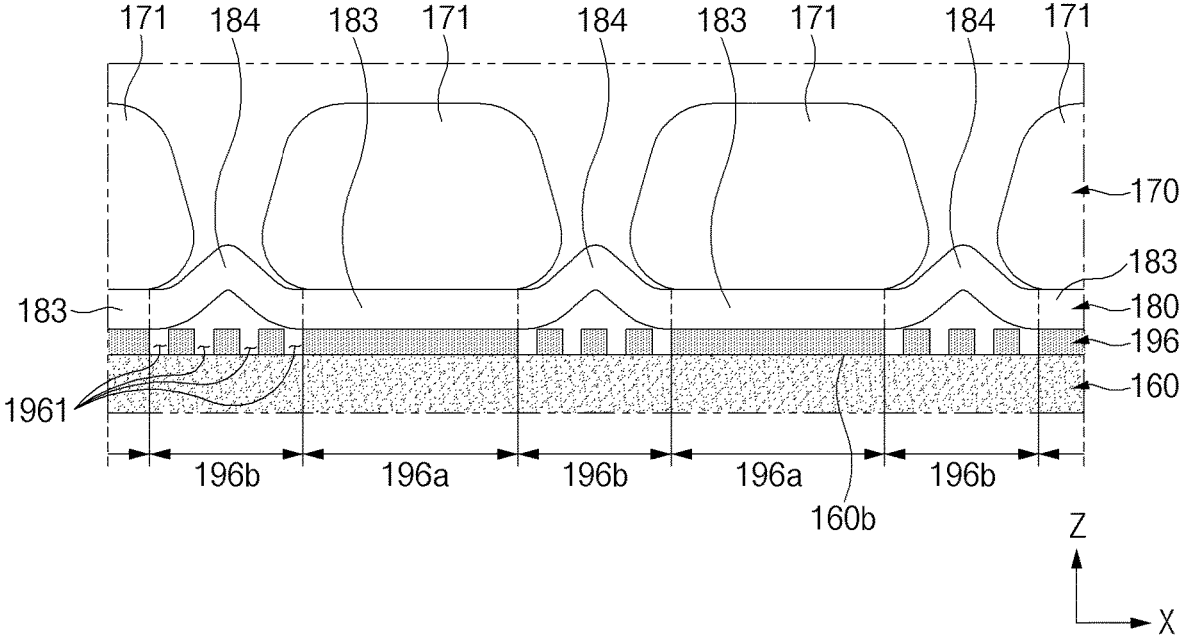
Figure 8:
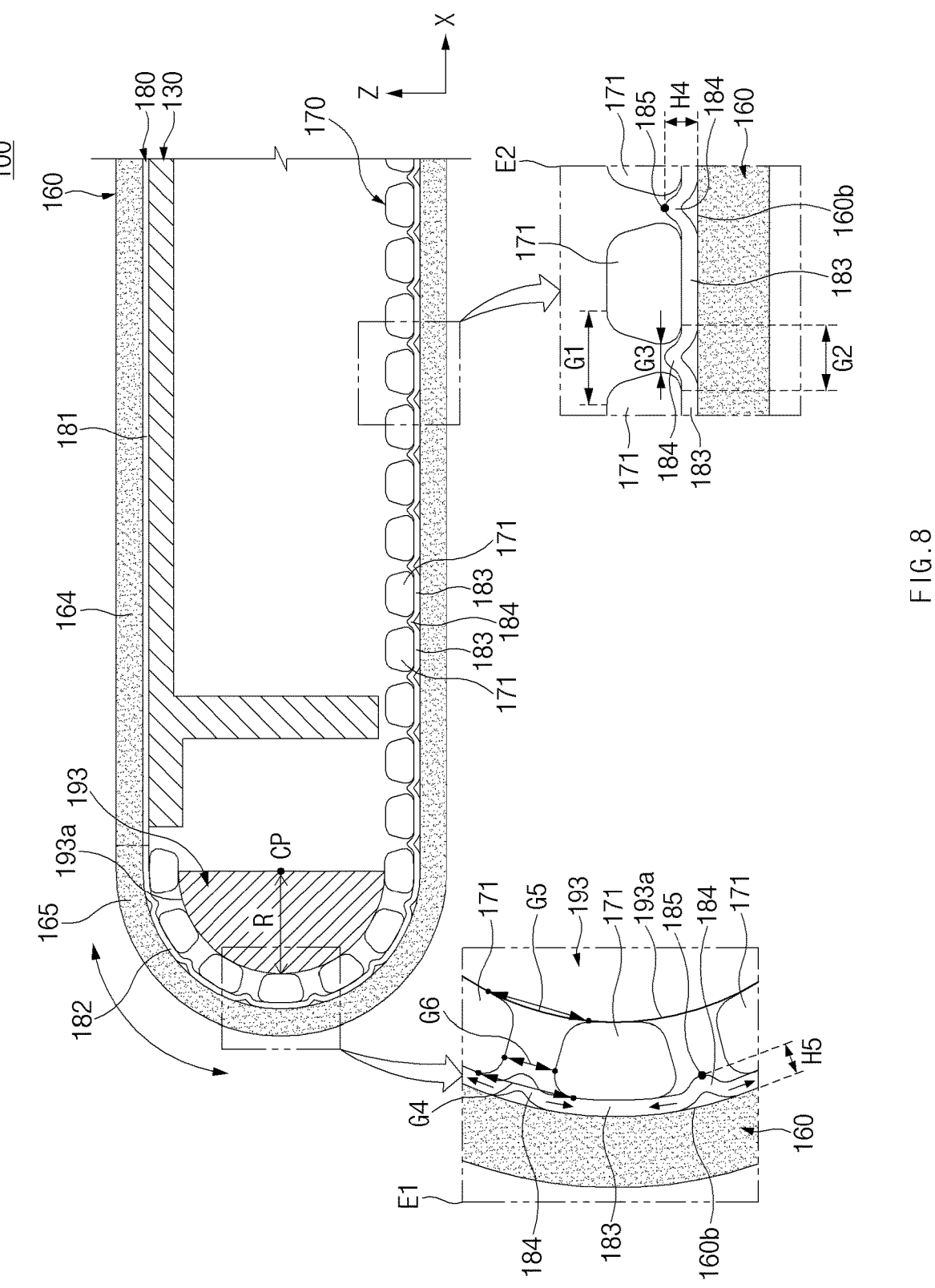
Figure 9A:
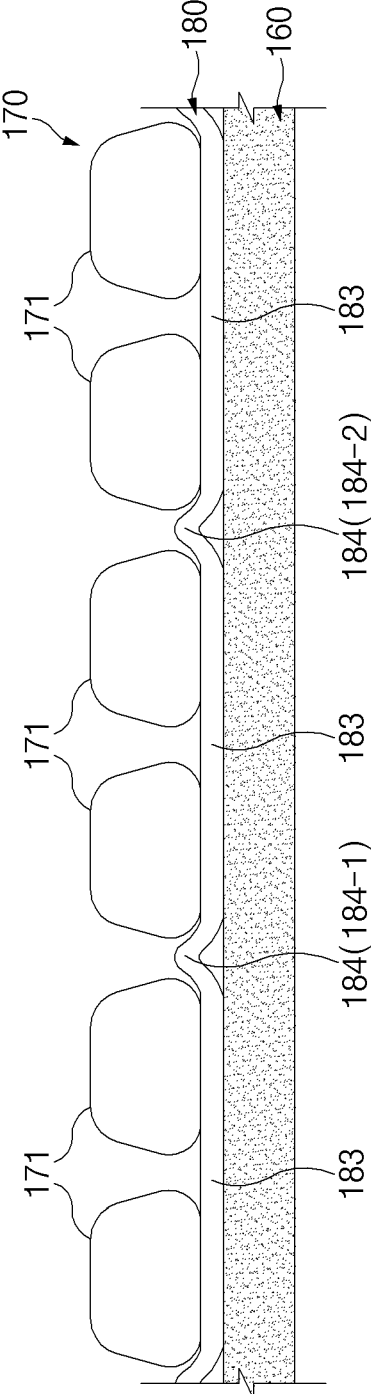
Figure 9B:
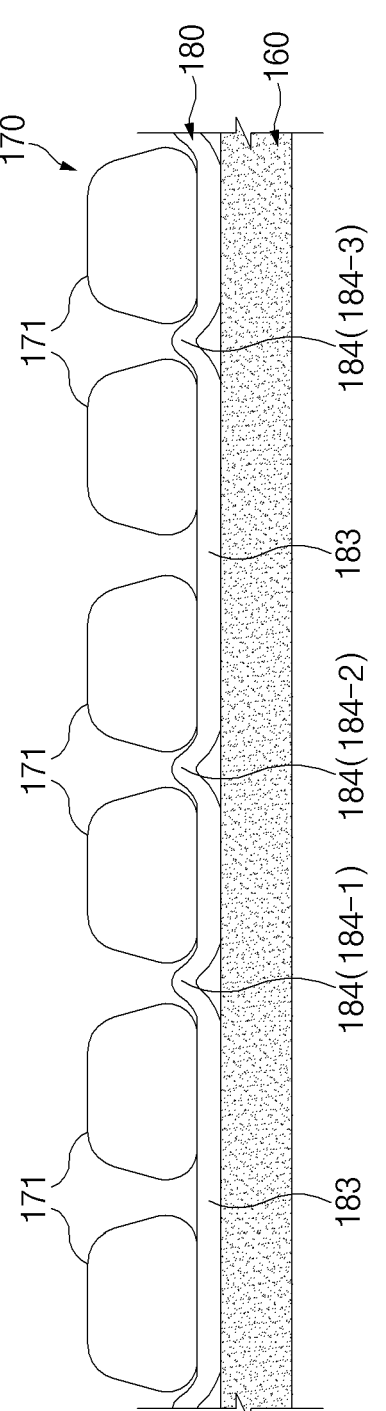
Figure 10A:
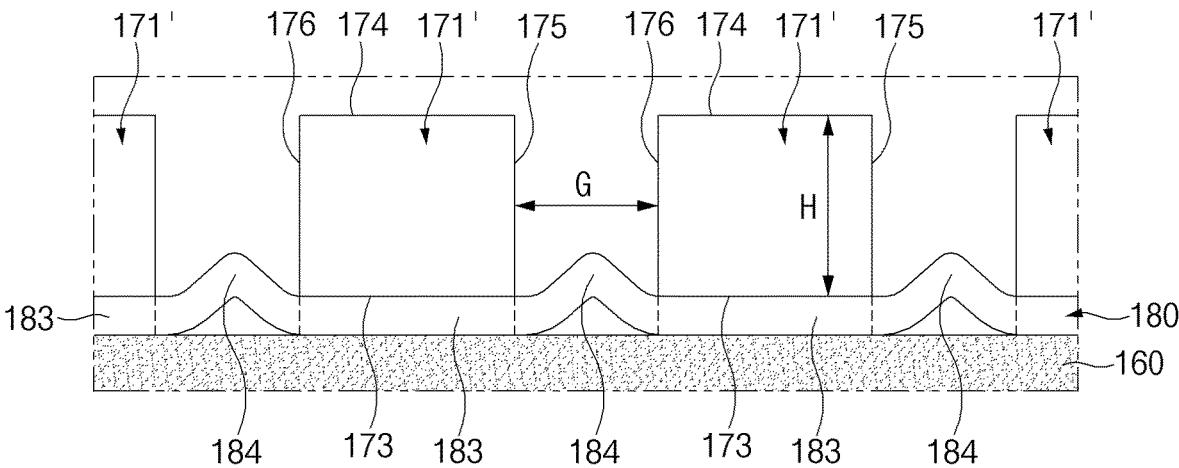
Figure 10B:
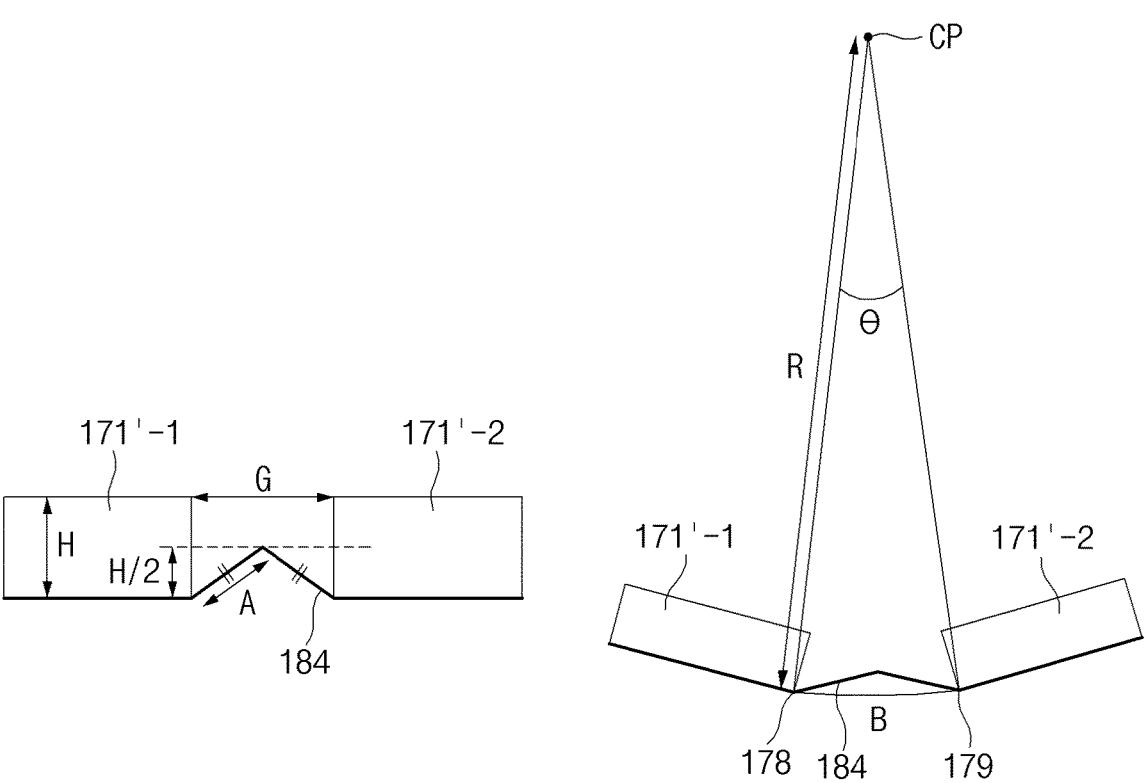
Figure 12:
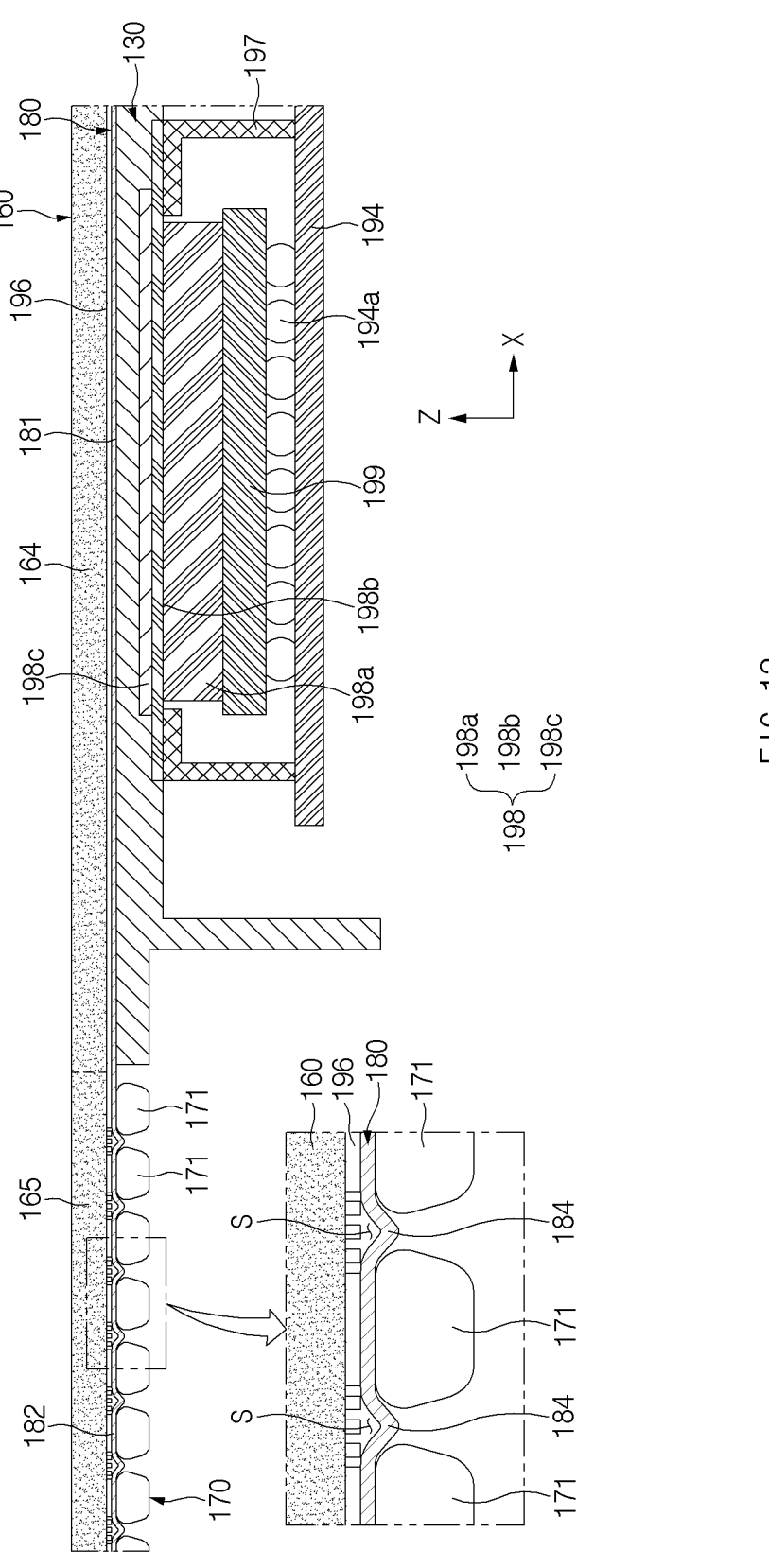
Figure 13B:
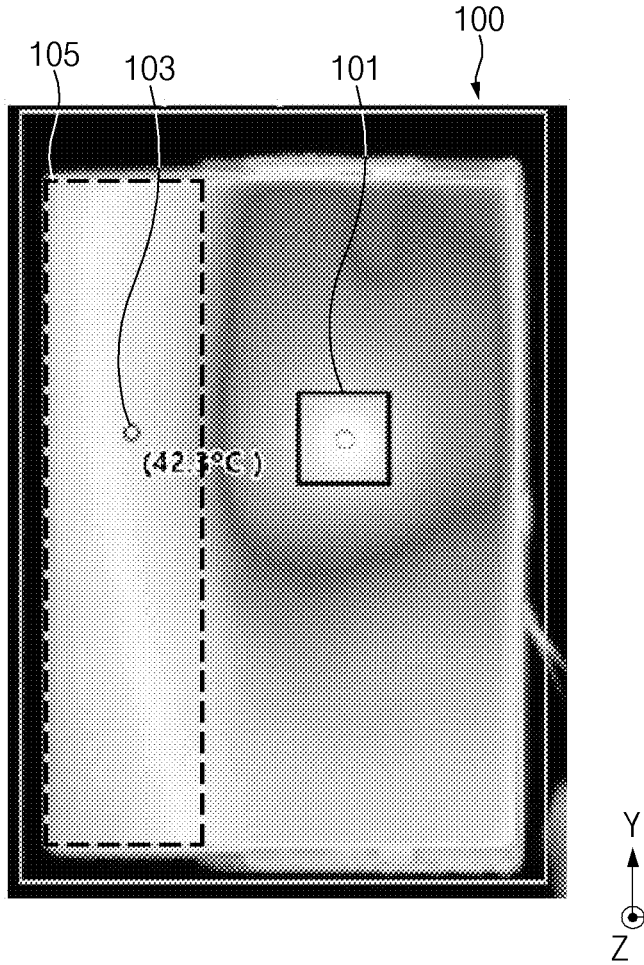
Figure 14:
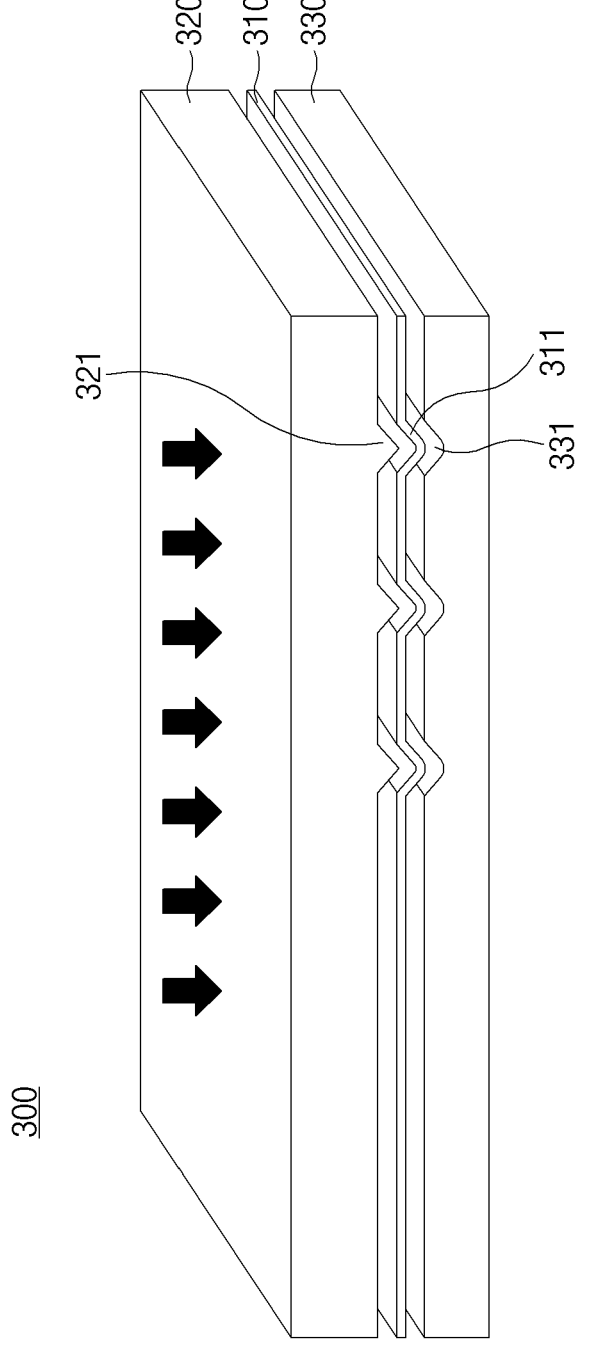
Figure 15A:
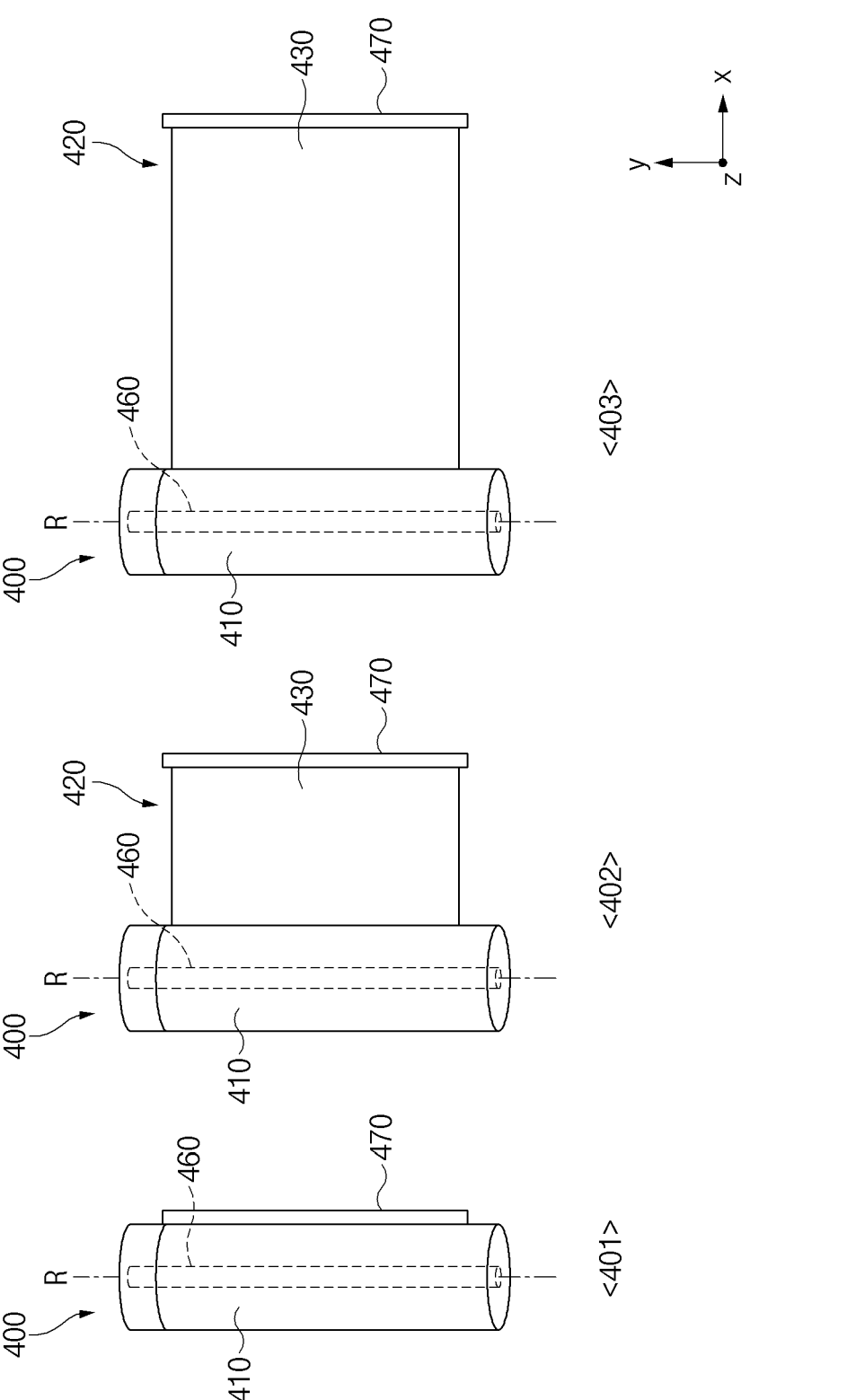
Figure 15B:
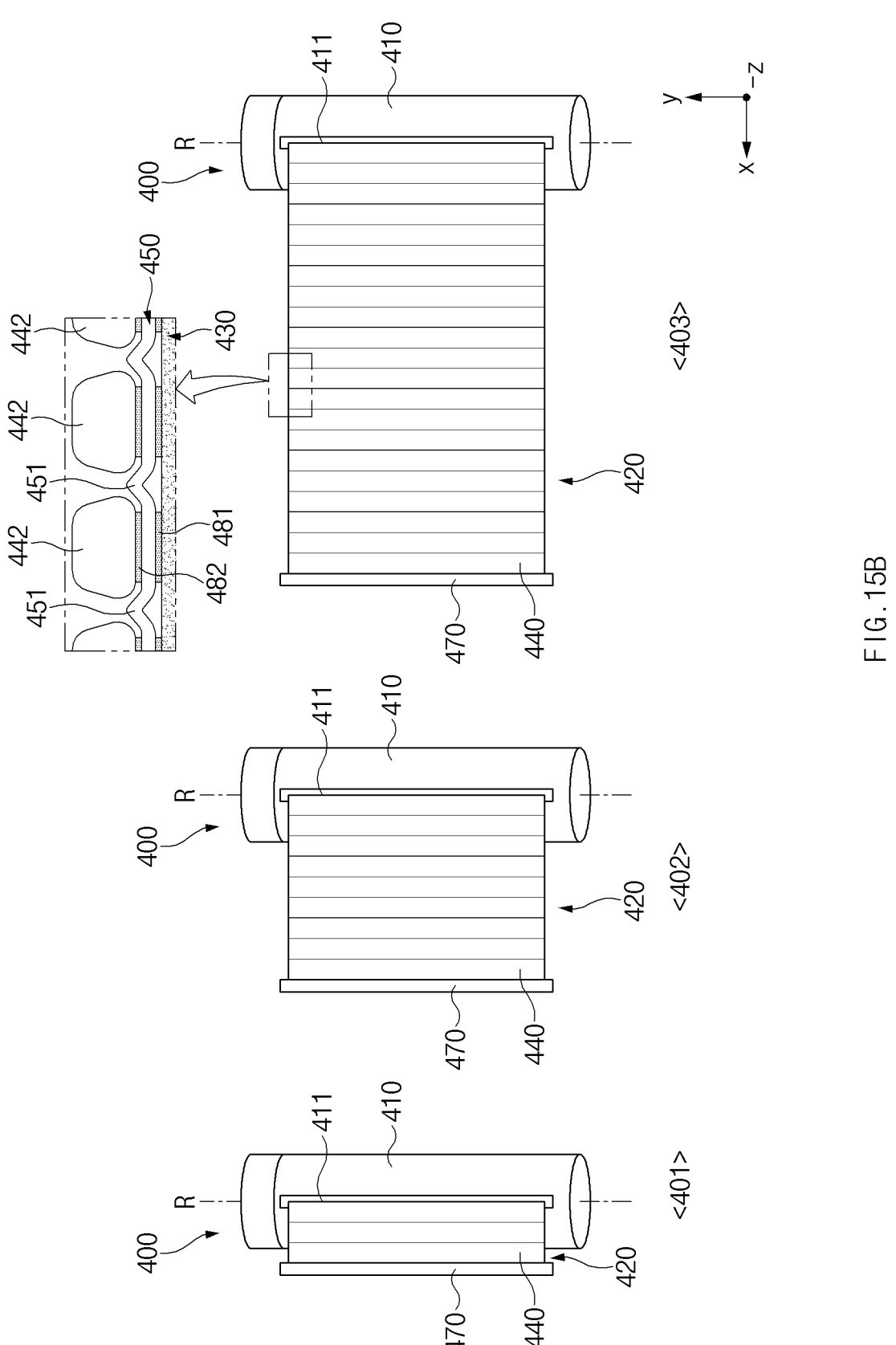
Figure 16:
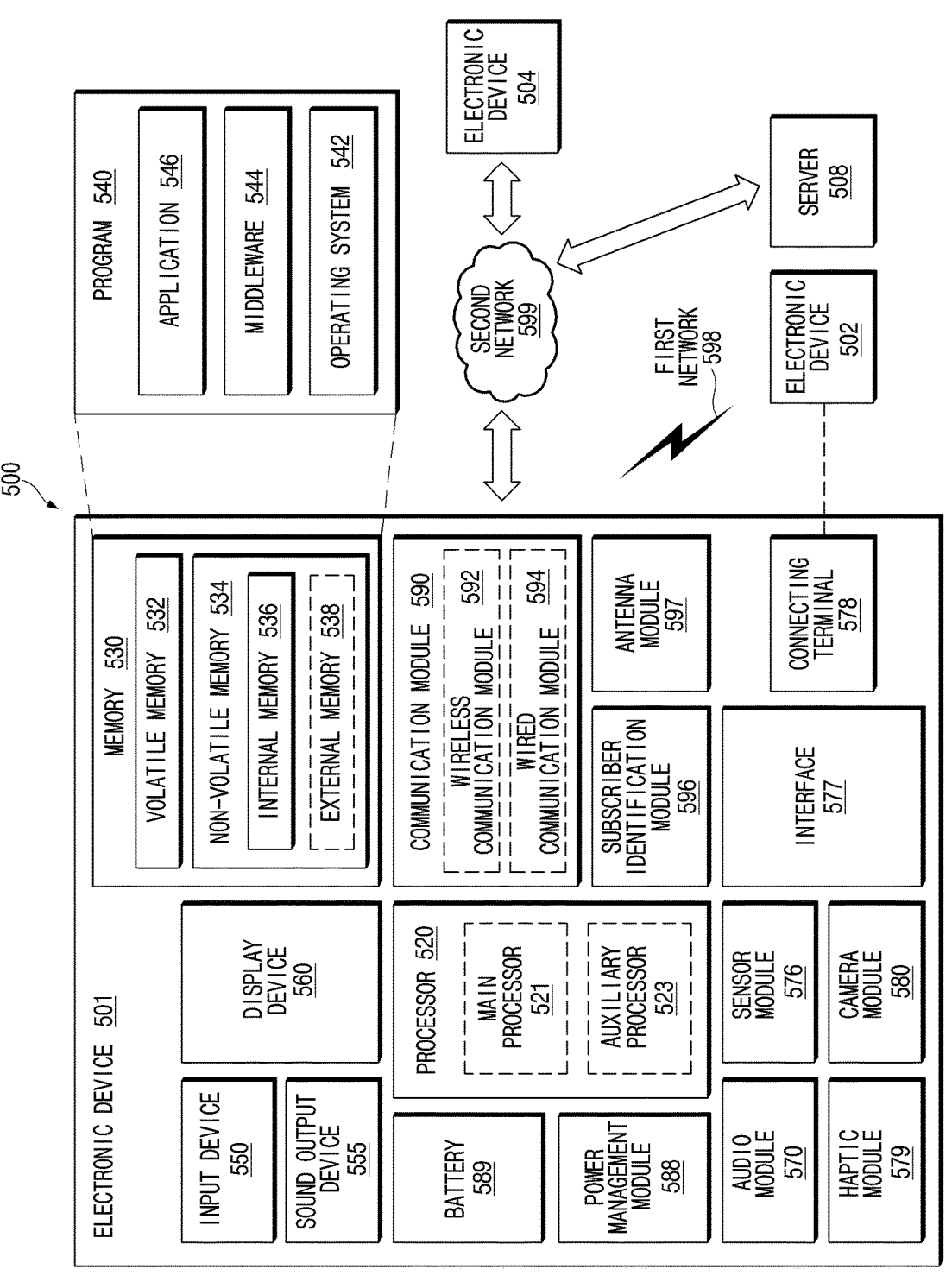

FIG. 1 is a view illustrating a first state of an electronic device according to an embodiment of the disclosure;

FIG. 2 is a view illustrating a second state of the electronic device according to an embodiment of the disclosure;

FIG. 3 is an exploded perspective view of the electronic device according to an embodiment of the disclosure;

FIGS. 4A and 4B are sectional views of the electronic device according to an embodiment of the disclosure;

FIGS. 5A and 5B are views illustrating a drive member of the electronic device according to an embodiment of the disclosure;

FIG. 6A is a view illustrating a flexible display, a flexible display support member, and a heat radiating sheet of the electronic device according to an embodiment of the disclosure;

FIG. 6B is a view illustrating a part of a plurality of support bars of the flexible display support member according to an embodiment of the disclosure;

FIG. 7 is a view illustrating the flexible display, the flexible display support member, the heat radiating sheet, and a reinforcing sheet of the electronic device according to an embodiment of the disclosure;

FIG. 8 is a view illustrating an operation in which the heat radiating sheet is deformed in response to a change of state of the electronic device according to an embodiment of the disclosure;

FIG. 9A is a view illustrating the flexible display support member and the heat radiating sheet of the electronic device according to an embodiment of the disclosure;

FIG. 9B is a view illustrating the flexible display support member and the heat radiating sheet of the electronic device according to an embodiment of the disclosure;

FIG. 10A is a view illustrating the flexible display support member and the heat radiating sheet of the electronic device according to an embodiment of the disclosure;

FIG. 10B is a view illustrating the flexible display support member and the heat radiating sheet of the electronic device according to an embodiment of the disclosure;

FIG. 11 is a view illustrating the second state of the electronic device according to an embodiment of the disclosure;

FIG. 12 is a view illustrating a heat radiating path of the electronic device according to an embodiment of the disclosure;

FIG. 13A is a view illustrating temperature distributions of electronic devices including heat radiating sheets according to an embodiment of the disclosure;

FIG. 13B is a view illustrating a temperature distribution of an electronic device after a life test is performed on the electronic device according to an embodiment of the disclosure;

FIG. 14 is a view illustrating a manufacturing method of a heat radiating sheet according to an embodiment of the disclosure;

FIG. 15A is a view illustrating a front side of an electronic device according to an embodiment of the disclosure;

FIG. 15B is a view illustrating a rear side of the electronic device according to an embodiment of the disclosure; and FIG. 16 is a block diagram illustrating an electronic device in a network environment, according to an embodiment of the disclosure.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory or the one or more computer programs may be divided with different portions stored in different multiple memories.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an integrated circuit (IC), or the like.

FIG. 1 is a view illustrating a first state of an electronic device according to an embodiment of the disclosure. FIG. 2 is a view illustrating a second state of the electronic device according to an embodiment of the disclosure.

Referring to FIGS. 1 and 2, the electronic device 100 according to an embodiment may include a first housing 110, a second housing 150, and a flexible display 160.

In an embodiment, the electronic device 100 may be an electronic device of a slidable type and may be changed to the first state (e.g., a closed mode, a retracted mode, or a slide-in mode) and the second state (e.g., an open mode, an extended mode, or a slide-out mode). The first state and the second state of the electronic device 100 may be determined depending on the position of the second housing 150 relative to the first housing 110. The electronic device 100 may be changed (or, switched) between the first state and the second state by a user operation or a mechanical operation.

In an embodiment, the first state may refer to a state in which the area (or, size) of the flexible display 160 that is exposed on the front side (e.g., the side facing the +z-axis direction) of the electronic device 100 (or, that forms the front side) is relatively reduced (refer to FIG. 1). The second state may refer to a state in which the area (or, size) of the flexible display 160 that is visually exposed on the front side of the electronic device 100 (or, that forms the front side) is relatively expanded (refer to FIG. 2). For example, the second state may be a state in which the area of the flexible display 160 visually exposed on the front side of the electronic device 100 is larger than that in the first state, and the area of the flexible display 160 exposed on the front side of the electronic device 100 may be largest when the electronic device 100 is in the second state. In an embodiment, the electronic device 100 may be changed through a plurality of intermediate states between the first state and the second state. For example, the plurality of intermediate states may refer to a plurality of states in which the area of the flexible display 160 that forms an exposed region is larger than that in the first state and smaller than that in the second state.

In an embodiment, the first state may refer to a closed state in which a portion of the second housing 150 (e.g., at least a portion of a fourth sidewall 152 and at least a portion of a fifth sidewall 153) is located inward of decorative members 125 and 126 of the first housing 110 so that the second housing 150 is closed to the first housing 110. The second state may refer to an opened state in which a portion of the fourth sidewall 152 and a portion of the fifth sidewall 153 move out of the first housing 110 so that the second housing 150 is open to the first housing 110.

In an embodiment, the first housing 110 and the second housing 150 may be coupled to slide relative to each other. The second housing 150 may be slidably coupled to one side of the first housing 110. For example, the first housing 110 may be a relatively first housing, and the second housing 150 may be a structure movable relative to the first housing 110. The second housing 150 may be coupled to the one side of the first housing 110 so as to slide relative to the first housing 110 in opposite directions D1 and D2 (e.g., the +x/−x-axis directions).

According to various embodiments, the first housing 110 may refer to a fixed structure, a fixed member, a fixed housing, a fixed case, or a main body. The second housing 150 may refer to a sliding structure, a sliding member (a slider), a sliding housing, a sliding case, or a sliding body.

In an embodiment, the second housing 150 may be provided to change the state of the electronic device 100 by sliding relative to the first housing 110. For example, the electronic device 100 may be changed to the second state (e.g., the state of FIG. 2) as the second housing 150 moves in the first direction D1 relative to the first housing 110 in the first state (e.g., the state of FIG. 1). In contrast, the electronic device 100 may be changed to the first state as the second housing 150 moves in the second direction D2 relative to the first housing 110 in the second state.

In an embodiment, the size (or, area) of a region of the flexible display 160 visually exposed on the front side of the electronic device 100 may be changed in response to a sliding motion of the second housing 150. The flexible display 160 may be configured such that the region exposed on the front side of the electronic device 100 is expanded or reduced as at least a portion of the flexible display 160 rotates and linearly moves depending on the sliding motion of the second housing 150 in the state in which the flexible display 160 is supported by other components (e.g., a bracket 130 and a flexible display support member 170 of FIG. 3) of the electronic device 100. The flexible display 160 may at least partially include a flexible portion. For example, the flexible display 160 may be a flexible display.

In an embodiment, the flexible display 160 may include a first region 161 and a second region 162 extending from the first region 161. The first region 161 may form the front side of the electronic device 100. For example, the first region 161 may remain visually exposed on the front side of the electronic device 100 irrespective of a state of the electronic device 100. The second region 162 may form the front side of the electronic device 100 in the second state. For example, whether the second region 162 is exposed on the front side of the electronic device 100 may be determined depending on a state of the electronic device 100.

In an embodiment, the area by which the second region 162 is exposed on the front side of the electronic device 100 may vary depending on a sliding distance of the second housing 150. For example, as the second housing 150 moves in the first direction D1 in the first state, the size of the second region 162 exposed on the front side of the electronic device 100 may be gradually increased. In various embodiments, the first region 161 may be understood as a default region, a fixed region, or a main region, and the second region 162 may be understood as an expanded region, a variable region, or a sub-region.

In an embodiment, the second region 162 may extend from the first region 161 in one direction. For example, the direction in which the second region 162 extends from the first region 161 may be substantially the same as the first direction D1 in which the second housing 150 moves when the electronic device 100 is expanded. For example, the second region 162 may extend from the first region 161 in the first direction D1. As the second housing 150 slides relative to the first housing 110, the second region 162 may move into the second housing 150 (e.g., slide-in motion), or may move out of the second housing 150 (e.g., slide-out motion).

In an embodiment, the first region 161 and the second region 162 of the flexible display 160 may be distinguished from each other, depending on whether the first region 161 and the second region 162 are exposed on the front side of the electronic device 100 in the first state. For example, the first region 161 may refer to a partial region of the flexible display 160 visually exposed on the front side of the electronic device 100 in the first state. The second region 162 may refer to another region of the flexible display 160 that is located inside the second housing 150 in the first state so as not to be exposed on the front side of the electronic device 100 and is at least partially moved out of the second housing 150 in the second state so as to be visually exposed on the front side of the electronic device 100. For example, the second region 162 may be understood as indicating the remaining region other than the first region 161 in the entire region of the flexible display 160. Furthermore, in embodiments of the disclosure, the first region 161 and the second region 162 of the flexible display 160 are not physically separated regions and do not mean that the shapes or properties differ from each other.

In an embodiment, the first state may be a state in which the first region 161 forms the front side of the electronic device 100 and the second region 162 is located inside the second housing 150. The second state may be a state in which at least a portion of the second region 162, together with the first region 161, forms the front side of the electronic device 100. For example, the second state may refer to a state in which the area by which the second region 162 is exposed on the front side of the electronic device 100 is maximal. In various embodiments, the second state may refer to any state in which the area of the flexible display 160 that forms the exposed region is larger than that in the first state and smaller than the maximum size.

In various embodiments, the flexible display 160 may form a screen display area that is visually exposed on the front side of the electronic device 100 and on which predetermined visual information (or, a screen) is displayed. For example, in the first state, the screen display area may be formed by the first region 161. In the second state, the screen display area may be formed by a portion of the second region 162 and the first region 161. In the second state, the electronic device 100 may provide an expanded screen display area, as compared with when the electronic device 100 is in the first state. For example, the screen display area may be substantially the same as the exposed region of the flexible display 160, or may be smaller than the exposed region.

FIG. 3 is an exploded perspective view of the electronic device according to an embodiment of the disclosure.

Referring to FIG. 3, the electronic device 100 according to an embodiment may include the first housing 110, a drive member 140, the second housing 150, the flexible display 160, the flexible display support member 170, a guide member 192, a roll bar 193, a circuit board 194, and a battery 195.

In an embodiment, the first housing 110 may include a case 120, a back cover 191, and the bracket 130. For example, the first housing 110 may be formed through a coupling structure in which the bracket 130 and the back cover 191 are coupled to the case 120. The back cover 191 and the bracket 130 may be fixed to the case 120, and the second housing 150 may move relative to the case 120, the back cover 191, and the bracket 130. For example, the first housing 110 may be a first housing on which a relative movement of the second housing 150 is based. According to the illustrated embodiment, the first housing 110 may be configured such that the case 120, the bracket 130, and the back cover 191 are assembled. However, this is illustrative, and the first housing 110 may be configured such that at least some of the case 120, the bracket 130, and the back cover 191 are integrally formed.

In an embodiment, the case 120 may be disposed between the bracket 130 and the back cover 191. The case 120, together with the back cover 191, may form a portion of the exterior of the electronic device 100. The bracket 130 and the back cover 191 may be coupled to the case 120. For example, the bracket 130 may be coupled to the front side (e.g., the side facing the +z-axis direction) of the case 120, and the back cover 191 may be coupled to the rear side (e.g., the side facing −z-axis direction) of the case 120.

In an embodiment, the case 120 may include a first plate portion 121 and a plurality of sidewalls 122, 123, and 124 extending from edges of the first plate portion 121.

In an embodiment, the first plate portion 121 may be formed to be substantially flat and may face the bracket 130 and the back cover 191. For example, the circuit board 194 or the battery 195 may be disposed between the first plate portion 121 and the bracket 130, and the back cover 191 may be coupled to the rear side of the first plate portion 121.

In an embodiment, the plurality of sidewalls 122, 123, and 124 may include the first sidewall 122 and the second sidewall 123 extending substantially vertically from the first plate portion 121 and facing each other, and the third sidewall 124 extending substantially perpendicular to the first sidewall 122 and the second sidewall 123. The first sidewall 122 may extend substantially vertically toward the bracket 130 from one longitudinal end portion (e.g., the peripheral portion facing the +y-axis direction) of the first plate portion 121. The second sidewall 123 may extend substantially vertically from an opposite longitudinal end portion (e.g., the peripheral portion facing the −y-axis direction) of the first plate portion 121 to face the first sidewall 122. The third sidewall 124 may extend substantially perpendicular to the first sidewall 122 and the second sidewall 123 to connect the first sidewall 122 and the second sidewall 123.

In an embodiment, the first sidewall 122 may form the side surface facing the +y-axis direction among the side surfaces of the electronic device 100, the second sidewall 123 may form the side surface facing the −y-axis direction among the side surfaces of the electronic device 100, and the third sidewall 124 may form the side surface facing the +x-axis direction among the side surfaces of the electronic device 100. The case 120 may be formed in a form in which a portion facing the third sidewall 124 is open. The second housing 150 may move in the first direction D1 and the second direction D2 relative to the case 120 through the open portion of the case 120.

In an embodiment, the case 120 may further include the decorative members 125 and 126 coupled to the first sidewall 122 and the second sidewall 123, respectively. The decorative members 125 and 126 may include the first decorative member 125 coupled to the first sidewall 122 and the second decorative member 126 coupled to the second sidewall 123. The decorative members 125 and 126 may improve the completeness of the electronic device 100 in appearance and the aesthetics thereof. For example, in the first state, the first decorative member 125 and the second decorative member 126 may hide a portion of the fourth sidewall 152 and a portion of the fifth sidewall 153 of the second housing 150 (e.g., refer to FIG. 1). According to various embodiments of the disclosure, the decorative members 125 and 126 may be integrally formed with the first sidewall 122 and the second sidewall 123.

In an embodiment, the back cover 191 may form the rear side (e.g., the side facing the −z-axis direction) of the electronic device 100. The back cover 191 may be coupled to the rear side of the case 120. The back cover 191 may be formed in a shape substantially corresponding to the first plate portion 121 of the case 120. According to various embodiments of the disclosure, the back cover 191 may be integrally formed with the case 120.

In an embodiment, the bracket 130 may be coupled to the case 120. For example, the bracket 130 coupled to the case 120 may form, between the first plate portion 121 and the bracket 130, a space in which other components (e.g., the circuit board 194 or the battery 195) of the electronic device 100 are disposed. The bracket 130 may support a partial region of the flexible display 160, the circuit board 194, or the battery 195. The bracket 130 may have a substantially plate shape and may be formed of a material having a specified stiffness.

In an embodiment, the bracket 130 may include a first surface 131 facing the front side of the electronic device 100 (e.g., the +z-axis direction) and a second surface 132 facing away from the first surface 131 (e.g., the −z-axis direction). For example, the second surface 132 may face the first plate portion 121 of the case 120.

In an embodiment, the first surface 131 of the bracket 130 may support at least a partial region of the flexible display 160. The first surface 131 may be formed to be flat to support the flexible display 160. A portion of the first region 161 of the flexible display 160 may be disposed on the first surface 131. For example, a portion of the first region 161 of the flexible display 160 may be fixed to the bracket 130 by being attached to the first surface 131. The circuit board 194 and the battery 195 may be disposed between the second surface 132 of the bracket 130 and the first plate portion 121. For example, the circuit board 194 and the battery 195 may be fixed to the bracket 130 by being coupled to the second surface 132.

In an embodiment, the drive member 140 may be connected to one side of the bracket 130. For example, a connecting portion (e.g., a connecting portion 135 of FIGS. 4A and 4B) to which the drive member 140 is connected may be formed on the one side of the bracket 130. The bracket 130 may include a first edge portion 133 facing the first direction D1 and a second edge portion 134 facing the second direction D2. For example, the first edge portion 133 and the second edge portion 134 may extend substantially perpendicular to the sliding direction of the second housing 150. The drive member 140 may be connected to the first edge portion 133 of the bracket 130.

According to various embodiments, the electronic device 100 may be configured in a form in which two second housings 150 are coupled to be movable in opposite directions relative to the first housing 110. In this case, the drive member 140 may be connected to the first edge portion 133 and the second edge portion 34 of the bracket 130 and may be simultaneously expanded in the first direction D1 and the second direction D2 when the flexible display 160 is expanded.

In an embodiment, the drive member 140 may provide a driving force to move the second housing 150 relative to the first housing 110. The drive member 140 illustrated in FIG. 3 may have a structure (e.g., refer to FIGS. 4A and 4B) in which one end is connected to the first edge portion 133 of the bracket 130 and an opposite end is connected to the roll bar 193. The drive member 140 may generate a physical force to move the roll bar 193 in the first direction D1 and/or the second direction D2 relative to the bracket 130. However, the form and/or structure of the drive member 140 is not limited to the illustrated embodiment, and various types of drive devices may be applied.

In various embodiments, the drive member may be provided by using a motor (not illustrated). For example, the drive member may include a motor configured to rotate in the clockwise or counterclockwise direction based on control of a processor (e.g., a processor 520 of FIG. 16). The second housing 150 and the first housing 110 may operate in conjunction with the motor through a gear structure (not illustrated), and the second housing 150 may be configured to move relative to the first housing 110 depending on a rotary motion of the motor.

In an embodiment, the second housing 150 may move in the first direction D1 and the second direction D2 relative to the case 120. The second housing 150 may move in the first direction D1 and the second direction D2 relative to the case 120 in the state in which at least a portion of the second housing 150 is disposed inside the case 120. For example, a portion of the second housing 150 may be surrounded by the first plate portion 121 and the plurality of sidewalls 122, 123, and 124 of the case 120. The guide member 192 and the roll bar 193 may be coupled to the second housing 150. For example, the second housing 150 may move relative to the case 120 together with the guide member 192 and the roll bar 193.

In an embodiment, the second housing 150 may include a second plate portion 151 and a plurality of sidewalls 152, 153, and 154 extending from edges of the second plate portion 151. For example, an inner space 155 surrounded by the second plate portion 151 and the plurality of sidewalls 152, 153, and 154 may be formed in the second housing 150.

In an embodiment, the second plate portion 151 may be formed to be substantially flat and may be substantially parallel to the first plate portion 121 of the case 120. The second plate portion 151 may be disposed between the first plate portion 121 and the bracket 130. For example, the second housing 150 may move relative to the case 120 in the state in which the second plate portion 151 partially overlaps the first plate portion 121.

In an embodiment, the plurality of sidewalls 152, 153, and 154 may include the fourth sidewall 152 and the fifth sidewall 153 extending substantially vertically from the second plate portion 151 and facing each other, and the sixth sidewall 154 extending substantially perpendicular to the fourth sidewall 152 and the fifth sidewall 153. The fourth sidewall 152 may vertically extend from one longitudinal end portion (e.g., the peripheral portion facing the +y-axis direction) of the second plate portion 151. The fifth sidewall 153 may vertically extend from an opposite longitudinal end portion (e.g., the peripheral portion facing the −y-axis direction) of the second plate portion 151 to face the fourth sidewall 152. The sixth sidewall 154 may extend substantially perpendicular to the fourth sidewall 152 and the fifth sidewall 153 to connect the fourth sidewall 152 and the fifth sidewall 153. According to the illustrated embodiment, the sixth sidewall 154 may extend from the second plate portion 151 while forming a curved surface. However, this is illustrative, and the shape of the sixth sidewall 154 is not limited to the illustrated embodiment.

In an embodiment, the fourth sidewall 152 and the fifth sidewall 153 may extend substantially parallel to the sliding directions D1 and D2 of the second housing 150, and the sixth sidewall 154 may extend substantially perpendicular to the sliding directions D1 and D2. The fourth sidewall 152 may extend parallel to the first sidewall 122 of the case 120, and the fifth sidewall 153 may extend parallel to the second sidewall 123 of the case 120. The second housing 150 may be disposed inside the case 120 such that the fourth sidewall 152 faces the inside surface of the first sidewall 122 and the fifth sidewall 153 faces the inside surface of the second sidewall 123. For example, the second housing 150 may move relative to the case 120 in the state in which the fourth sidewall 152 partially overlaps the first sidewall 122 and the fifth sidewall 153 partially overlaps the second sidewall 123.

In an embodiment, when the electronic device 100 is in the second state, the fourth sidewall 152 and the fifth sidewall 153 may form some of the side surfaces of the electronic device 100 together with the first sidewall 122 and the second sidewall 123. For example, in the second state, the fourth sidewall 152, together with the first sidewall 122, may form the side surface facing the +y-axis direction among the side surfaces of the electronic device 100. In the second state, the fifth sidewall 153, together with the second sidewall 123, may form the side surface facing the −y-axis direction among the side surfaces of the electronic device 100. When the electronic device 100 is in the first state, the fourth sidewall 152 and the fifth sidewall 153 may be hidden by the first sidewall 122 and the second sidewall 123 and may not be exposed in the lateral directions (e.g., the y-axis directions) of the electronic device 100. The sixth sidewall 154 may face the third sidewall 124 and may form the side surface facing the −x-axis direction among the side surfaces of the electronic device 100. The second housing 150 may be formed in a form in which a portion facing the sixth sidewall 154 is open.

In an embodiment, the guide member 192 may guide movement of the flexible display 160 and the flexible display support member 170. The guide member 192 may be fixedly disposed on the second housing 150. For example, the guide member 192, together with the second housing 150, may move in the opposite directions D1 and D2 relative to the first housing 110.

In an embodiment, the guide member 192 may have guide grooves 1921 in which opposite end portions of the flexible display support member 170 in the lengthwise direction (e.g., the y-axis direction) are disposed. For example, the flexible display support member 170 may move along the guide grooves 1921 in response to movement of the second housing 150 and the guide member 192 in the state in which the opposite longitudinal end portions of the flexible display support member 170 are inserted into the guide grooves 1921. The guide member 192 may guide movement of the flexible display support member 170 along a predetermined path (or, track) corresponding to the guide grooves 1921 and may support the flexible display support member 170 such that the flexible display support member 170 remains flat.

In an embodiment, the guide member 192 may include a first guide member 192a disposed on the fourth sidewall 152 of the second housing 150 and a second guide member 192b disposed on the fifth sidewall 153 of the second housing 150. The first guide member 192a and the second guide member 192b may be disposed inside the second housing 150 to face each other. The first guide member 192a and the second guide member 192b may be formed in shapes corresponding to the fourth sidewall 152 and the fifth sidewall 153, respectively.

According to the illustrated embodiment, the guide member 192 may be formed as a separate component from the second housing 150 and may be provided in a structure coupled to the second housing 150. However, without being limited thereto, the guide member 192 may be integrally formed with the second housing 150. For example, the guide member 192 may be integrally formed with the fourth sidewall 152 and the fifth sidewall 153, or the guide grooves 1921 may be formed on the inside surfaces of the fourth sidewall 152 and the fifth sidewall 153.

In an embodiment, the flexible display 160 may be supported by the bracket 130 and the flexible display support member 170. For example, a partial region of the flexible display 160 may be fixed to the first housing 110 by being supported on the bracket 130, and another partial region of the flexible display 160 may be configured to rotate and linearly move in response to a sliding motion of the second housing 150 in the state of being supported by the flexible display support member 170.

In an embodiment, the flexible display 160 may include the first region 161 and the second region 162 extending from the first region 161. A portion of the first region 161 may be disposed on the first surface 131 of the bracket 130. For example, a portion of the first region 161 may be fixed by being attached to the first surface 131 of the bracket 130. The second region 162 may be supported by the flexible display support member 170. For example, the flexible display support member 170 may be attached to the rear surface of the second region 162, and the second region 162 may move together with the flexible display support member 170.

In an embodiment, the flexible display support member 170 may support at least a partial region of the flexible display 160. The flexible display support member 170 may be attached to the rear surface of the flexible display 160, and at least a portion of the flexible display support member

170 may be curved (or, bent) in response to sliding of the second housing 150. For example, the flexible display support member 170 may be implemented in a bendable form to partially form a curved surface in response to sliding of the second housing 150. In various embodiments, the flexible display support member 170 may be formed in a form in which a multi-bar (e.g., a plurality of support bars 171 of FIGS. 6A and 6B) is integrally attached to a flexible sheet. However, this is illustrative, and the multi-bar 171 may be implemented as a separate component on the flexible sheet.

In an embodiment, the roll bar 193 may be disposed in the second housing 150 to move together with the second housing 150. For example, inside the second housing 150, the roll bar 193 may be located adjacent to the sixth sidewall 154, and opposite end portions of the roll bar 193 may be coupled to the fourth sidewall 152 and the fifth sidewall 153, respectively. The roll bar 193 may extend in a direction substantially perpendicular to the sliding directions D1 and D2 of the second housing 150. The drive member 140 may be connected to one side of the roll bar 193. At least a portion of the roll bar 193 may be surrounded by the flexible display support member 170. At least a portion of the flexible display support member 170 may move along one surface of the roll bar 193 in response to sliding of the second housing 150.

In an embodiment, the circuit board 194 may be disposed on the first housing 110. The circuit board 194 may be disposed between the bracket 130 and the case 120. For example, the circuit board 194 may be supported by the bracket 130 and may be fixed to the first housing 110 accordingly. The circuit board 194, together with the first housing 110, may move relative to the second housing 150 when the second housing 150 slides.

In an embodiment, the circuit board 194 may include a printed circuit board (PCB), a flexible PCB (FPCB), or a rigid-flexible PCB (RFPCB). Various electronic components included in the electronic device 100 may be electrically connected to the circuit board 194. The processor (e.g., the processor 520 of FIG. 16), memory (e.g., memory 530 of FIG. 16), and/or an interface (e.g., an interface 577 of FIG. 16) may be disposed on the circuit board 194.

For example, the processor may include a main processor and/or an auxiliary processor, and the main processor and/or the auxiliary processor may include one or more of a central processing unit, an application processor, a graphic processing unit, an image signal processor, a sensor hub processor, or a communication processor. For example, the memory may include volatile memory or nonvolatile memory. For example, the interface may include a high definition multimedia interface (HDMI), a universal serial bus (USB) interface, an SD card interface, and/or an audio interface. Furthermore, the interface may electrically or physically connect the electronic device 100 with an external electronic device and may include a USB connector, an SD card/MMC connector, or an audio connector.

In an embodiment, the battery 195 may supply power to at least one component of the electronic device 100. The battery 195 may be integrally disposed inside the electronic device 100, or may be disposed so as to be detachable from the electronic device 100. For example, the battery 195 may be disposed on the first housing 110. The battery 195, together with the circuit board 194, may be supported by the bracket 130 and may be fixed to the first housing 110 accordingly. The battery 195, together with the first housing 110, may move relative to the second housing 150 when the second housing 150 slides.

The electronic device 100 illustrated in FIG. 3 may be an embodiment of an electronic device of a slidable type, and the structure of the electronic device 100 according to various embodiments of the disclosure is not limited to the illustrated embodiment. For example, the electronic device 100 according to various embodiments of the disclosure may be implemented with various forms of slidable electronic devices that include a first housing and a movable structure movable relative to the first housing and in which a display area is expanded or reduced as a flexible display moves together with the movable structure.

The electronic device 100 illustrated in FIG. 3 may have a form in which a partial region of the flexible display 160 is fixedly disposed on the first housing 110 and an expanded region of the flexible display 160 moves out of or into the second housing 150. However, without being limited thereto, according to various embodiments, the electronic device 100 may have a form in which a partial region of the flexible display 160 is fixedly disposed on the second housing 150 and moves together with the second housing 150 and an expanded region of the flexible display 160 moves out of or into the first housing 110. In the above-described embodiment, the roll bar 193 may be disposed in the first housing 110, and the flexible display 160 and the flexible display support member 170 may move along the roll bar 193.

FIGS. 4A and 4B are sectional views of the electronic device according to an embodiment of the disclosure.

FIG. 4A is a sectional view illustrating the first state of the electronic device, and FIG. 4B is a sectional view illustrating the second state of the electronic device.

FIG. 4A may be a sectional view of the electronic device taken along line A-A' in FIG. 1, and FIG. 4B may be a sectional view of the electronic device taken along line B-B' in FIG. 2.

Referring to FIGS. 4A and 4B, the electronic device 100 according to an embodiment may include the first housing 110, the drive member 140, the second housing 150, the flexible display 160, the flexible display support member 170, the roll bar 193, and the battery 195.

Some of the components of the electronic device 100 illustrated in FIGS. 4A and 4B are identical or similar to some of the components of the electronic device 100 illustrated in FIGS. 1 to 3, and therefore repetitive descriptions will hereinafter be omitted.

In an embodiment, the electronic device 100 may be changed to the first state (e.g., FIG. 4A) and the second state (e.g., FIG. 4B) by a sliding motion of the second housing 150 relative to the first housing 110. The first housing 110 may be a relatively first housing with respect to the sliding of the second housing 150.

In an embodiment, the first housing 110 may include the case 120, the back cover 191, and the bracket 130. For example, the second housing 150 may move in the first direction D1 and the second direction D2 relative to the case 120, the back cover 191, and the bracket 130.

In an embodiment, the connecting portion 135, to which the drive member 140 is connected, may be formed on the one side of the bracket 130. The drive member 140 may be connected to the bracket 130. For example, the bracket 130 may include the first edge portion 133 facing the roll bar 193 and the second edge portion 134 facing the third sidewall 124 of the case 120. The connecting portion 135 may be formed on the first edge portion 133. For example, the connecting portion 135 may protrude from the first edge portion 133 toward the roll bar 193. For example, the connecting portion 135 may extend from the first edge portion 133 in the first direction D1.

In an embodiment, when the first surface 131 of the bracket 130 is viewed from above, the first plate portion 121 and the second plate portion 151 may partially overlap each other. The size of the area or width by which the first plate portion 121 and the second plate portion 151 overlap each other may be changed in response to a sliding motion of the second housing 150. For example, the area by which the first plate portion 121 and the second plate portion 151 overlap each other may be relatively smaller in the second state than in the first state.

In an embodiment, the second housing 150 may be configured to move in the first direction D1 and the second direction D2 relative to the fixed structure 110. For example, the second plate portion 151 of the second housing 150 may move between the bracket 130 and the first plate portion 121. The second plate portion 151 may form the rear side of the electronic device 100 together with the first plate portion 121 or the back cover 191 in the second state. The roll bar 193 may be coupled to the second housing 150 and may move together with the second housing 150 when the second housing 150 moves.

In an embodiment, at least a portion of the flexible display 160 may be disposed inside the second housing 150. Depending on a sliding motion of the second housing 150, at least a portion of the flexible display 160 may be disposed in the inner space 155 of the second housing 150, or may move out of the inner space 155 of the second housing 150. For example, a portion of the flexible display 160 facing the rear side of the electronic device 100 (e.g., the −z-axis direction) so as to be opposite the first plate portion 121 of the case 120 in the first state may be exposed on the front side of the electronic device 100 while moving out of the second housing 150 when the second housing 150 moves in the first direction D1. Furthermore, as the second housing 150 moves in the second direction D2 in the second state, the portion of the flexible display 160 exposed on the front side of the electronic device 100 may be located to face the rear side of the electronic device 100 while moving into the second housing 150.

According to various embodiments (not illustrated), a transparent region (not illustrated) may be formed in the case 120, the back cover 191, and the second housing 150 such that the flexible display 160 is visually exposed on the rear side of the electronic device 100. For example, the first plate portion 121, the back cover 191, and the second plate portion 151 may have transparent regions formed in corresponding positions, and in the first state, a portion of the flexible display 160 (e.g., a portion of the second region 162) may be visually exposed on the rear side of the electronic device 100 through the transparent regions of the first plate portion 121, the second plate portion 151, and the back cover 191. Accordingly, when the electronic device 100 is in the first state, the screen display area of the flexible display 160 may be formed on at least a portion of the front side of the electronic device 100 and at least a portion of the rear side thereof.

In an embodiment, the flexible display 160 may include the first region 161 that forms the front side of the electronic device 100 in the first state and the second region 162 that extends from the first region 161 and forms the front side of the electronic device 100 together with the first region 161 in the second state. For example, in the first state, the second region 162 may be disposed inside the second housing 150, and in the second state, at least a portion of the second region 162 may move out of the second housing 150 to form the front side of the electronic device 100.

In an embodiment, the first region 161 and the second region 162 of the flexible display 160 may be distinguished from each other, depending on whether the first region 161 and the second region 162 are exposed on the front side of the electronic device 100 in the first state. The position of the border between the first region 161 and the second region 162 is not limited to a specific position according to the illustrated embodiment. For example, when a portion (e.g., the sixth sidewall 154 of FIG. 3) of the second housing 150 surrounding the flexible display 160 is formed in a higher or lower position than that in the illustrated embodiment, the positions of the first region 161 and the second region 162 may be changed accordingly.

In an embodiment, the flexible display 160 may be configured such that at least a portion of the first region 161 is fixed to the first housing 110 (e.g., the bracket 130) and as the second housing 150 moves in the opposite directions D1 and D2 relative to the first housing 110, a portion of the second region 162 is disposed inside the second housing 150 to face the first region 161, or a portion of the second region 162 moves out of the second housing 150 to form substantially the same plane as the first region 161. A portion of the first region 161 may be supported by the first surface 131 of the bracket 130, and another portion of the first region 161 may be supported by the flexible display support member 170. The second region 162 may be supported by the flexible display support member 170.

In an embodiment, the portion of the flexible display 160 supported by the first surface 131 of the bracket 130 may remain substantially flat irrespective of movement of the second housing 150. Furthermore, the portion of the flexible display 160 supported by the flexible display support member 170 may be deformed to be curved or flat depending on movement of the second housing 150. For example, the portion of the flexible display 160 supported by the bracket 130 may be a rigid portion, and the portion of the flexible display 160 supported by the flexible display support member 170 may be a flexible portion. According to the illustrated embodiment, the first region 161 may include the rigid portion and a portion of the flexible portion, and the second region 162 may include the remaining portion of the flexible portion. However, without being limited thereto, the entire flexible display 160 may be formed of a flexible material in various embodiments.

In an embodiment, the flexible display support member 170 may support a portion of the first region 161 and the second region 162. For example, the flexible display support member 170 may be attached to portions of the rear surface of the flexible display 160 that correspond to the portion of the first region 161 and the second region 162. The flexible display support member 170 may move together with a partial region of the flexible display 160.

In an embodiment, the flexible display support member 170 may include a plurality of support bars extending in a direction substantially perpendicular to the sliding directions D1 and D2 of the second housing 150. For example, the flexible display support member 170 may be formed in a form (e.g., a multi-joint module or a multi-bar module) in which the plurality of support bars extending substantially parallel to the roll bar 193 are spaced apart from each other by a predetermined gap. In various embodiments, the flexible display support member 170 may refer to a flexible track or a hinge rail. The flexible display support member 170 may be bent at portions having a relatively small thickness between the plurality of support bars. The shape of the flexible display support member 170 will be described below in detail with reference to FIG. 6.

In an embodiment, the flexible display support member 170 may surround at least a portion of the roll bar 193 and may partially make contact with the roll bar 193. For example, the flexible display support member 170 (or, the flexible display 160) may be partially bent while surrounding the roll bar 193. A portion of the flexible display support member 170 may be disposed between the second housing 150 and the roll bar 193 and may move along one surface of the roll bar 193 in response to sliding of the second housing 150. For example, when the second housing 150 moves in the first direction D1 in the first state, a portion of the flexible display support member 170 (or, the second region 162) may move out of the space between the second housing 150 and the roll bar 193. In contrast, when the second housing 150 moves in the second direction D2 in the second state, a portion of the flexible display support member 170 (or, the second region 162) may move into the space between the second housing 150 and the roll bar 193.

In an embodiment, the roll bar 193 may guide a rotational movement of the flexible display support member 170 and the flexible display 160. The roll bar 193, together with the second housing 150, may move in the first direction D1 and the second direction D2 relative to the first housing 110. The roll bar 193 may be surrounded by the flexible display support member 170 (or, the flexible display 160). For example, one surface of the roll bar 193 that makes contact with the flexible display support member 170 may be formed to be substantially curved such that at least a portion of the flexible display support member 170 performs a sliding motion along the one surface of the roll bar 193.

In an embodiment, the drive member 140 may be disposed to connect the bracket 130 and the roll bar 193. The one end of the drive member 140 (e.g., first arm 141) may be connected to the connecting portion 135 of the bracket 130, and the opposite end of the drive member 140 (e.g., second arm 142) may be connected to the roll bar 193. The drive member 140 may move the roll bar 193 in the first direction D1 from the bracket 130 while the opposite end portions (e.g., first arm 141 and second arm 142) move away from each other. For example, the drive member 140 may be implemented with an elastic member. In the first state, the drive member 140 may be in a state in which the elastic member is compressed as the opposite end portions (e.g., first arm 141 and second arm 142) are located close to each other. The drive member 140 may apply an elastic force to the roll bar 193 (e.g., the second housing 150) in the first direction D1 with respect to the bracket 130 (e.g., the first housing 110) while the opposite end portions of the drive member 140 move away from each other as the elastic member is uncompressed. Hereinafter, an operation of the drive member 140 will be described with reference to FIGS. 5A and 5B.

FIGS. 5A and 5B are views illustrating the drive member of the electronic device according to an embodiment of the disclosure.

Referring to FIGS. 5A and 5B, the drive member 140 of the electronic device 100 according to an embodiment may include a first arm 141, a second arm 142, a rotary shaft 143, and an elastic member 144. The drive member 140 may be configured such that the first arm 141 and the second arm 142 rotate about the rotary shaft 143 relative to each other.

In an embodiment, the first arm 141 and the second arm 142 may be connected to be rotatable about the rotary shaft 143. For example, one end of the first arm 141 and one end of the second arm 142 may be connected through the rotary shaft 143. The first arm 141 and the second arm 142 may rotate about the rotary shaft 143 within a specified range. The rotary shaft 143 may extend in a direction substantially perpendicular to the sliding directions D1 and D2 of the second housing 150.

In an embodiment, the first arm 141 may include a first connecting shaft 145 formed at an opposite end of the first arm 141. The second arm 142 may include a second connecting shaft 146 formed at an opposite end of the second arm 142. The first connecting shaft 145 of the first arm 141 and the second connecting shaft 146 of the second arm 142 may move toward or away from each other depending on rotation of the first arm 141 and the second arm 142.

In an embodiment, the first connecting shaft 145 and the second connecting shaft 146 may be spaced apart from each other by a predetermined distance (e.g., L1 or L2). For example, the predetermined distance may be a distance measured from the first connecting shaft 145 to the second connecting shaft 146 in a direction parallel to the sliding directions D1 and D2.

In an embodiment, the elastic member 144 may be configured to provide an elastic force to the first arm 141 and the second arm 142. For example, the elastic member 144 may provide an elastic force to the first arm 141 and the second arm 142 such that the first connecting shaft 145 and the second connecting shaft 146 move away from each other.

In an embodiment, the elastic member 144 may include a torsion spring. For example, the elastic member 144 may include a portion at least partially wound around the portion to which the rotary shaft 143 is coupled and portions extending from the wound portion along the first arm 141 and the second arm 142. The wound portion may have a form wound around the rotary shaft 143. As illustrated in FIGS. 5A and 5B, the elastic member 144 may be at least partially accommodated in recesses 147 formed on surfaces of the first arm 141 and the second arm 142 that face each other.

In an embodiment, the elastic member 144 may be disposed such that one end portion is fixed to the first arm 141 and an opposite end portion is fixed to the second arm 142. Between the first arm 141 and the second arm 142, the elastic member 144 may generate an elastic force in the direction in which the first connecting shaft 145 of the first arm 141 and the second connecting shaft 146 of the second arm 142 move away from each other. For example, the driving force provided by the drive member 140 may refer to the elastic force of the elastic member 144.

According to the illustrated embodiment, the drive member 140 including the torsion spring may be configured to apply a driving force by rotary motions of the first arm 141 and the second arm 142. However, the drive member 140 is not limited thereto. In various embodiments (not illustrated), the elastic member 144 may include a coil spring (not illustrated). For example, the elastic member 144 may directly connect the first connecting shaft 145 and the second connecting shaft 146. The elastic member 144 may have a form extending in a direction parallel to the sliding directions. The one end portion of the elastic member 144 having the form of a coil spring may be coupled to the first connecting shaft 145 or the portion where the first connecting shaft 145 of the first arm 141 is located, and the opposite end portion of the elastic member 144 may be coupled to the second connecting shaft 146 or the portion where the second connecting shaft 146 of the second arm 142 is located.

In an embodiment, the elastic member 144 may be compressed when the first arm 141 and the second arm 142 are disposed in parallel to face each other (e.g., FIG. 5A) and may be relatively uncompressed when the first arm 141 and the second arm 142 form a predetermined angle (e.g., FIG. 5B).

Referring to FIGS. 4A and 4B, the first connecting shaft 145 may be connected to the connecting portion 135 of the bracket 130, and the second connecting shaft 146 may be connected to the roll bar 193. For example, the first connecting shaft 145 may be coupled to the bracket 130 so as to be rotatable, and the second connecting shaft 146 may be coupled to the roll bar 193 so as to be rotatable. When the first connecting shaft 145 and the second connecting shaft 146 move toward each other, the bracket 130 and the roll bar 193 may move toward each other, and when the first connecting shaft 145 and the second connecting shaft 146 move away from each other, the bracket 130 and the roll bar 193 may move away from each other.

In an embodiment, when the electronic device 100 is in the first state (e.g., the state of FIG. 4A), the distance between the first connecting shaft 145 and the second connecting shaft 146 may be a first length L1, and the elastic member 144 may be in a compressed state.

In an embodiment, when the electronic device 100 is in the second state (e.g., the state of FIG. 4B), the distance between the first connecting shaft 145 and the second connecting shaft 146 may be a second length L2 longer than the first length L1, and the elastic member 144 may be in an uncompressed state. For example, in the second state, the first arm 141 and the second arm 142 may form a predetermined angle "a". The predetermined angle "a" may be an included angle defined between the first arm 141 and the second arm 142 when the bracket 130 is viewed from above.

In an embodiment, the operating distance by which the roll bar 193 moves relative to the bracket 130 (e.g., the operating distance by which the second housing 150 moves in the first direction D1 or the second direction D1 relative to the first housing 110 in FIGS. 4A and 4B) may be substantially the same as the difference between the second length L2 and the first length L1.

In an embodiment, the drive member 140 may support the flexible display support member 170 when the electronic device 100 is in the second state. Referring to FIG. 4B, in the second state, a portion of the flexible display support member 170 may form substantially the same plane as the first surface 131 of the bracket 130. For example, when the first surface 131 of the bracket 130 is viewed from above, the drive member 140 may overlap the flexible display support member 170. The drive member 140 may be located on the rear surface of the flexible display support member 170 and may prevent sagging of the flexible display support member 170 into the space between the roll bar 193 and the bracket 130.

The drive member 140 described with reference to FIGS. 4 and 5 is illustrative, and in embodiments of the disclosure, the drive member 140 may be changed into various forms or structures.

FIG. 6A is a view illustrating the flexible display, the flexible display support member, and a heat radiating sheet of the electronic device according to an embodiment of the disclosure. FIG. 6B is a view illustrating some of the plurality of support bars of the flexible display support member according to an embodiment of the disclosure.

FIG. 6A may be a view illustrating a portion of the sectional view of FIGS. 4A and 4B to describe the heat radiating sheet 180 located between the flexible display support member 170 and the flexible display 160. For example, FIG. 6A may be a view in which at least some components (e.g., the case 120, the drive member 140, the second housing 150, the back cover 191, the roll bar 193, the circuit board 194, and/or the battery 195) among the components of the electronic device 100 illustrated in FIGS. 4A and 4B are omitted.

FIG. 6B may be a view illustrating two adjacent bars 171-1 and 171-2 among the plurality of support bars 171 to describe a relationship between bars disposed adjacent to each other among the plurality of support bars 171 included in the flexible display support member 170.

Referring to FIGS. 6A and 6B, the electronic device 100 according to an embodiment may include the bracket 130, the flexible display 160, the flexible display support member 170, and the heat radiating sheet 180.

Some of the components of the electronic device 100 illustrated in FIGS. 6A and 6B may be identical or similar to some of the components of the electronic device 100 illustrated in FIGS. 1 to 4, and repetitive descriptions will hereinafter be omitted.

In an embodiment, the flexible display 160 may include a first surface 160a and a second surface 160b facing away from the first surface 160a. The heat radiating sheet 180 and the flexible display support member 170 may be attached to the second surface 160b of the flexible display 160. For example, the first surface 160a of the flexible display 160 may refer to the outside surface (or, the front surface) facing toward the outside of the electronic device 100 so as to be visually exposed to a user, and the second surface 160b may refer to the inside surface (or, the rear surface) facing toward the inside of the electronic device 100.

In an embodiment, at least a portion of the flexible display 160 may be deformed to be curved or flat as a state of the electronic device 100 (e.g., the first state or the second state) is changed. The flexible display 160 may include a base portion 164 and a rollable portion 165 extending from the base portion 164. For example, the base portion 164 may be a portion, the form of which is maintained and/or fixed irrespective of a state of the electronic device 100, and the rollable portion 165 may be a portion that flexibly extends from the base portion 164 to have variability. At least a portion of the rollable portion 165 may be deformed to be curved or flat as a state of the electronic device 100 is changed. The base portion 164 may be formed of a rigid material, and the rollable portion 165 may be formed of a flexible material. However, the disclosure is not limited thereto.

In an embodiment, the base portion 164 of the flexible display 160 may be disposed on the upper surface of the bracket 130 (e.g., the first surface 131 of FIG. 3 or the surface facing the +z-axis direction) so as to be supported by the bracket 130. The flexible display support member 170 may be disposed on the second surface 160b of the rollable portion 165 such that the rollable portion 165 of the flexible display 160 is supported by the flexible display support member 170.

Referring to FIGS. 4A and 4B, the base portion 164 may form the first region 161 of the flexible display 160 together with a portion of the rollable portion 165. The rest of the rollable portion 165 may form the second region 162 of the flexible display 160. However, as the first region 161 and the second region 162 of the flexible display 160 are distinguished from each other depending on whether the first region 161 and the second region 162 are exposed on the front side of the electronic device 100 in the first state, the relationship between the first region 161, the second region 162, the base portion 164, and the rollable portion 165 is not limited to the above-described example. In various embodiments, the electronic device 100 may be changed such that the base portion 164 forms the first region 161 and the rollable portion 165 forms the second region 162.

In an embodiment, the flexible display support member 170 may be disposed on the rear surface (e.g., the second surface 160b) of the flexible display 160 to support a portion of the flexible display 160. For example, the flexible display support member 170 may be attached to the second surface 160b of the rollable portion 165 to support the rollable portion 165 of the flexible display 160. For example, the flexible display support member 170 may be disposed on the second surface 160b of the rollable portion 165 by being attached to at least a portion of the heat radiating sheet 180 attached to the second surface 160b of the rollable portion 165. The flexible display support member 170 may be formed of a metallic material or a polymer material, but is not limited thereto.

In an embodiment, the flexible display support member 170 may include the plurality of support bars 171. The plurality of support bars 171 may extend in a direction (e.g., the y-axis direction) perpendicular to the sliding directions D1 and D2. The flexible display support member 170 may be formed in a shape in which the plurality of support bars 171 are arranged with a specified gap in a direction (e.g., the x-axis direction) parallel to the sliding directions D1 and D2. For example, the extension length of the plurality of support bars 171 may correspond to the length of the flexible display 160 (e.g., the length of the flexible display 160 in the y-axis direction in FIGS. 1 to 3). Without being limited to the illustrated embodiment, the flexible display support member 170 may be implemented with various forms of support members capable of contributing to a sliding and/or rolling motion of the flexible display 160 when the flexible display 160 moves. Although not illustrated, the flexible display support member 170 may partially form a curved path as at least some of the support bars 171 are disposed to surround a roll bar (e.g., the roll bar 193 of FIGS. 4A and 4B).

In an embodiment, the plurality of support bars 171 may be formed in a shape in which the cross-sectional area is increased in the direction toward the flexible display 160. Each of the plurality of support bars 171 may include a third surface 173 (e.g., a lower surface) facing the second surface 160b of the flexible display 160, a fourth surface (e.g., an upper surface) facing away from the third surface 173, and a fifth surface 175 (e.g., a first side surface) and a sixth surface 176 (e.g., a second side surface) that connect the third surface 173 and the fourth surface 174 and face away from each other.

In an embodiment, the bar 171 may be formed such that the fourth surface 174 has a smaller area than the third surface 173. When the cross-section of the bar 171 is viewed, the length of the fourth surface 174 in the sliding directions D1 and D2 may be shorter than the length of the third surface 173 in the sliding directions D1 and D2. The fifth surface 175 and the sixth surface 176 may extend to be inclined toward the center of the bar 171 in the direction from the third surface 173 toward the fourth surface 174.

In an embodiment, the bar 171 may have rounded corners. The fifth surface 175 and the sixth surface 176 may extend from the third surface 173 and the fourth surface 174 so as to be rounded. For example, the third surface 173 and the fourth surface 174 of the bar 171 may be substantially flat, and the fifth surface 175 and the sixth surface 176 may have a flat portion and curved portions.

In an embodiment, the gap between adjacent bars among the plurality of support bars 171 may vary in the direction of the height H of the plurality of support bars 171. For example, the direction of the height H may be understood as a direction perpendicular to the third surfaces 173 and the fourth surfaces 174 of the plurality of support bars 171. The plurality of support bars 171 may include the first bar 171-1 and the second bar 171-2 disposed adjacent to each other. For example, the fifth surface 175 of the first bar 171-1 and the sixth surface 176 of the second bar 171-2 may be disposed to face each other. The gap between the third surface 173 of the first bar 171-1 and the third surface 173 of the second bar 171-2 may be a first gap G1. The gap between the fourth surface 174 of the first bar 171-1 and the fourth surface 174 of the second bar 171-2 may be a second gap G2 greater than the first gap G1. The gap between the fifth surface 175 of the first bar 171-1 and the sixth surface 176 of the second bar 171-2 may be a third gap G3 smaller than the first gap G1.

In an embodiment, the third gap G3 between the fifth surface 175 of the first bar 171-1 and the sixth surface 176 of the second bar 171-2 may be understood as the distance between points closest to each other on the fifth surface 175 and the sixth surface 176 in the x-axis direction. For example, points on the fifth surface 175 and the sixth surface 176 that are furthest from the center lines CL of the first and second bars 171-1 and 171-2 may be defined as a first point P1 and a second point P2, and the third gap G3 may be the distance between the first point P1 and the second point P2. The first point P1 and the second point P2 may be understood as the outermost points on the fifth surface 175 and the sixth surface 176 when the cross-sections of the first and second bars 171-1 and 171-2 are viewed. The height of the first point P1 and the second point P2 may be a third height H3. The third height H3 may be the distance between the first point P1 and the third surface 173 or the distance between the second point P2 and the third surface 173. For example, the third height H3 may be smaller than one half of the height H of the first and second bars 171-1 and 171-2.

The above-described gap between the first bar 171-1 and the second bar 171-2 may be understood as the gap between the plurality of support bars 171 disposed on the flat rollable portion 165 in the enlarged view of FIG. 6A, and as the rollable portion 165 is deformed to be curved, the gap between the plurality of support bars 171 may be changed. An operation in which the gap between the plurality of support bars 171 is changed depending on the shape of the rollable portion 165 will be described below with reference to FIG. 8.

In an embodiment, the plurality of support bars 171 may be fixedly disposed on at least a partial region of the heat radiating sheet 180 by attachment of the third surfaces 173 to the heat radiating sheet 180. A plurality of first adhesive members 188 may be disposed between the third surfaces 173 of the plurality of support bars 171 and the heat radiating sheet 180. The plurality of support bars 171 may be attached to the heat radiating sheet 180 by using the plurality of first adhesive members 188. For example, the plurality of first adhesive members 188 may be formed of a flexible material such that the flexible display support member 170 is deformed together with the flexible display 160. The plurality of support bars 171 may be configured such that the remaining surfaces 174, 175, and 176 other than the third surface 173 are not attached with the heat radiating sheet 180.

In embodiments of the disclosure, the shape of the plurality of support bars 171 is not limited to the shape illustrated in FIGS. 6A and 6B. The plurality of support bars 171 may have various shapes. For example, the plurality of support bars 171 may be formed to have angular corners. Alternatively, the plurality of support bars 171 may be formed in a rectangular shape having the same cross-sectional area (refer to FIGS. 10A and 10B). When the plurality of support bars 171 are formed in a rectangular shape, the gap between adjacent bars among the plurality of support bars 171 may be constant irrespective of positions in the height direction unlike in FIG. 6B.

In an embodiment, the heat radiating sheet 180 may be disposed on the rear surface (e.g., the second surface 160b) of the flexible display 160. The heat radiating sheet 180 may be disposed between the flexible display 160 and the flexible display support member 170 and between the flexible display 160 and the bracket 130. For example, the heat radiating sheet 180 may extend in the extension direction of the flexible display 160 such that one portion is disposed between the second surface 160b of the base portion 164 and the bracket 130 and another portion is disposed between the second surface 160b of the rollable portion 165 and the flexible display support member 170. The heat radiating sheet 180 for diffusing or spreading heat generated from a heat source in the electronic device 100 may be formed of a material having predetermined thermal conductivity or thermal diffusivity and may be configured to provide a heat radiating path along the flexible display 160.

In an embodiment, the heat radiating sheet 180 may be formed in a shape corresponding to the flexible display 160. For example, the heat radiating sheet 180 may be formed in a shape corresponding to the length (e.g., the distance in the y-axis direction) and/or the width (e.g., the distance in the x-axis direction) of the flexible display 160 to face most of the second surface 160b of the flexible display 160.

In an embodiment, the heat radiating sheet 180 may be attached to the second surface 160b of the flexible display 160. For example, a plurality of second adhesive members 189 may be disposed between the heat radiating sheet 180 and the flexible display 160 so as to be spaced apart from each other by a predetermined gap. Partial regions of the heat radiating sheet 180 may be attached to partial regions of the second surface 160b of the flexible display 160 through the plurality of second adhesive members 189. For example, the heat radiating sheet 180 may include regions attached to the flexible display 160 and regions not attached to the flexible display 160 such that the shape of the heat radiating sheet 180 is partially deformed depending on a change of state of the electronic device 100.

In an embodiment, the heat radiating sheet 180 may be configured such that at least portions thereof are located between the plurality of support bars 171 of the flexible display support member 170. For example, at least portions of the heat radiating sheet 180 may be formed in a corrugated shape in the sliding directions D1 and D2, and the corrugated portions may be located between the plurality of support bars 171. The heat radiating sheet 180 may contain a flexible material. Accordingly, the corrugated portions of the heat radiating sheet 180 may be deformed depending on movement of the flexible display 160.

In an embodiment, the heat radiating sheet 180 may be formed in a film form in which a section (e.g., a second portion 182) folded between the plurality of support bars 171 and a section (e.g., a first portion 181) remaining flat are continuously connected. For example, the section folded between the plurality of support bars 171 may be a section in which corrugated portions (e.g., folding portions 184) alternate with flat portions (e.g., attachment portions 183) and may be configured such that the corrugated portions are located between the plurality of support bars 171.

In an embodiment, the heat radiating sheet 180 may include the first portion 181 attached to the base portion 164 of the flexible display 160 and the second portion 182 attached to the rollable portion 165 of the flexible display 160. For example, the first portion 181 may overlap the base portion 164, and the second portion 182 may extend from the first portion 181 to overlap the rollable portion 165. The heat radiating sheet 180 may be formed such that the second portion 182 has a corrugated shape. For example, the corrugated portions may be formed in the second portion 182 and may not be formed in the first portion 181. Hereinafter, components forming a corrugated structure in the second portion 182 of the heat radiating sheet 180 will be described.

In an embodiment, the heat radiating sheet 180 may include the plurality of attachment portions 183 and the plurality of folding portions 184. At least a portion of the heat radiating sheet 180 may be formed in a shape in which the attachment portions 183 alternate with the folding portions 184. For example, the plurality of attachment portions 183 and the plurality of folding portions 184 may be formed in the second portion 182 of the heat radiating sheet 180. The second portion 182 may be formed in a corrugated structure as the attachment portions 183 and the folding portions 184 repeatedly extend in the sliding directions D1 and D2. For example, a first attachment portion 183-1 may be located between a first folding portion 184-1 and a second folding portion 184-2 adjacent to each other. The first folding portion 184-1 may be located between the first attachment portion 183-1 and a second attachment portion 183-2 adjacent to each other.

In an embodiment, the plurality of attachment portions 183 may be attached with the plurality of support bars 171 and partial regions of the flexible display 160. For example, the plurality of attachment portions 183 may be attached with the third surfaces 173 of the plurality of support bars 171 through the plurality of first adhesive members 188. The plurality of attachment portions 183 may be attached to partial regions of the second surface 160*b* of the rollable portion 165 through the plurality of second adhesive members 189. In an embodiment, the first adhesive members 188 and the second adhesive members 189 may be formed in substantially the same size. For example, the areas of adhesive surfaces of the first adhesive members 188 may be substantially the same as the areas of adhesive surfaces of the second adhesive members 189.

In an embodiment, the plurality of folding portions 184 may be formed such that at least portions thereof are located between the plurality of support bars 171 disposed adjacent to each other. The plurality of folding portions 184 may extend from the plurality of attachment portions 183 toward the plurality of support bars 171 such that at least portions thereof are located in spaces separating the plurality of support bars 171. At least portions of the plurality of folding portions 184 may be located in the spaces between the fifth surfaces 175 and the sixth surfaces 176 of the plurality of adjacent bars 171. For example, the first folding portion 184-1 may extend from the first attachment portion 183-1 and the second attachment portion 183-2 while being bent toward the space between the fifth surface 175 of the first bar 171-1 and the sixth surface 176 of the second bar 171-2.

In an embodiment, the number of folding portions 184 or the spacing therebetween may be formed to correspond to the spaces separating the plurality of support bars 171. For example, the plurality of folding portions 184 may be formed with one bar 171 therebetween. Based on FIG. 6A, the plurality of support bars 171 may be attached to the plurality of attachment portions 183, respectively, and each of the plurality of folding portions 184 may be located between the plurality of adjacent support bars 171. However, the number of folding portions 184 or the spacing therebetween may be changed according to various embodiments (e.g., refer to FIGS. 9A and 9B) without being limited to the illustrated embodiment.

In an embodiment, the plurality of folding portions 184 may be formed in a pointed shape to have peaks 185 protruding above the plurality of attachment portions 183. For example, the peaks 185 may refer to the top portions or vertex portions of the plurality of folding portions 184. The peaks 185 of the plurality of folding portions 184 may be located between the fifth surfaces 175 and the sixth surfaces 176 of the plurality of adjacent support bars 171.

In an embodiment, the plurality of folding portions 184 may be deformed to correspond to a flat section and a curved section of the rollable portion 165 of the flexible display 160. For example, the plurality of folding portions 184 may be deformed such that the heights of the peaks 185 are decreased in response to an operation in which the rollable portion 165 is deformed from a flat surface to a curved surface. The deformation of the plurality of folding portions 184 will be described below with reference to FIG. 8.

In an embodiment, the plurality of folding portions 184 may be formed such that the peaks 185 are located at a same height as the first points P1 and the second points P2 of the plurality of support bars 171 or at a height lower than the first points P1 and the second points P2. For example, the peaks 185 of the plurality of folding portions 184 may be located at a first height H1 with respect to the second surface 160*b* of the flexible display 160. The first points P1 and the second points P2 of the plurality of support bars 171 may be located at a second height H2 greater than or equal to the first height H1 with respect to the second surface 160*b* of the flexible display 160. For example, the first height H1 may be smaller than or equal to the second height H2. Accordingly, due to a change in the gap between the plurality of support bars 171 in an operation in which the rollable portion 165 is deformed to be flat or curved, the heat radiating sheet 180 may be prevented from being caught between the plurality of support bars 171 and damaged. The first height H1 and the second height H2 described above may be understood as being described based on the plurality of folding portions 184 and the plurality of support bars 171 that correspond to the flat rollable portion 165 in the enlarged view of FIG. 6A. When the rollable portion 165 is deformed to be curved, the first height H1 and the second height H2 may be changed.

In an embodiment, the heat radiating sheet 180 may include a graphite sheet (or, film) or a carbon fiber sheet (or, film). For example, the heat radiating sheet 180 may be formed in a form in which a graphite film and a polyethylene naphthalate (PEN) film are laminated. The corrugated structure (e.g., the plurality of attachment portions 183 and the plurality of folding portions 184) of the heat radiating sheet 180 may be formed by thermally processing the laminated heat radiating sheet 180.

In the descriptions of FIGS. 6A and 6B, the content in which the plurality of support bars 171 include the first bar 171-1 and the second bar 171-2, the content in which the plurality of attachment portions 183 include the first attachment portion 183-1 and the second attachment portion 183-2, and the content in which the plurality of folding portions 184 include the first folding portion 184-1 and the second folding portion 184-2 may be understood as indicating some components disposed adjacent to each other to describe the positional relationship therebetween, and the disclosure is not limited to including two support bars 171, two attachment portions 183, and two folding portions 184.

FIG. 7 is a view illustrating the flexible display, the flexible display support member, the heat radiating sheet, and a reinforcing sheet of the electronic device according to an embodiment of the disclosure.

Referring to FIG. 7, the electronic device 100 according to an embodiment may include the flexible display 160, the flexible display support member 170, the heat radiating sheet 180, and the reinforcing sheet 196.

FIG. 7 may be a view illustrating an embodiment in which the reinforcing sheet 196 is additionally included in the electronic device 100 illustrated in FIG. 6A. Some of the components of the electronic device 100 illustrated in FIG. 7 may be identical or similar to some of the components of the electronic device 100 illustrated in FIG. 6A, and repetitive descriptions will hereinafter be omitted.

In an embodiment, the plurality of support bars 171 of the flexible display support member 170 may be attached to the plurality of attachment portions 183 of the heat radiating sheet 180. The plurality of attachment portions 183 of the heat radiating sheet 180 may be attached to portions of the reinforcing sheet 196. FIG. 7 may be a view in which the first adhesive members 188 and the second adhesive members 189 are omitted. For example, in the embodiment illustrated in FIG. 7, it may be understood that the plurality of support bars 171 are attached to the plurality of attachment portions 183 through the first adhesive members 188 and the plurality of attachment portions 183 are attached to portions of the reinforcing sheet 196 through the second adhesive members 189.

In an embodiment, the reinforcing sheet 196 may be disposed between the flexible display 160 and the heat radiating sheet 180. The reinforcing sheet 196 between the flexible display 160 and the heat radiating sheet 180 may provide a function of strengthening the flexible display 160. For example, the reinforcing sheet 196 may be formed of a stainless use steel (SUS) material, but is not limited thereto.

In an embodiment, the reinforcing sheet 196 may be attached to the second surface 160b of the flexible display 160. For example, the reinforcing sheet 196 may be attached to the second surface 160b of the flexible display 160 through an adhesive member (not illustrated). At least portions of the reinforcing sheet 196 may be attached with the heat radiating sheet 180. For example, portions of the reinforcing sheet 196 may be attached with the plurality of attachment portions 183 of the heat radiating sheet 180 through a plurality of second adhesive members (e.g., the second adhesive members 189 of FIG. 6A). The remaining portions of the reinforcing sheet 196 may not be attached with the heat radiating sheet 180.

In an embodiment, the reinforcing sheet 196 may include a plurality of first portions 196a to which the plurality of attachment portions 183 of the heat radiating sheet 180 are attached and a plurality of second portions 196b located between the plurality of first portions 196a. Lattice patterns 1961 (or, slit patterns) may be formed in the plurality of second portions 196b to secure flexibility. For example, the lattice patterns 1961 may be formed to be long in a direction parallel to the extension direction of the plurality of support bars 171 or a direction (e.g., the y-axis direction) perpendicular to the sliding directions D1 and D2.

In an embodiment, the plurality of first portions 196a of the reinforcing sheet 196 may correspond to the plurality of attachment portions 813 of the heat radiating sheet 180. The plurality of second portions 196b of the reinforcing sheet 196 may correspond to the plurality of folding portions 814 of the heat radiating sheet 180. For example, when the second surface 160b of the flexible display 160 is viewed from above, the plurality of attachment portions 183 may overlap the plurality of first portions 196a, and the plurality of folding portions 184 may overlap the plurality of second portions 196b. The plurality of attachment portions 183 may be attached to the plurality of first portions 196a through the second adhesive members 189. The plurality of second portions 196b may not be attached with the plurality of folding portions 184.

FIG. 8 is a view illustrating an operation in which the heat radiating sheet is deformed in response to a change of state of the electronic device according to an embodiment of the disclosure.

FIG. 8 may be a view illustrating the shapes of the flexible display 160, the flexible display support member 170, and the heat radiating sheet 180 when the electronic device 100 is in the first state. <E1> of FIG. 8 is an enlarged view illustrating a portion of a section in which the rollable portion 165 forms a curved surface, and <E2> of FIG. 8 is an enlarged view illustrating a portion of a section in which the rollable portion 165 forms a flat surface.

Referring to FIG. 8, the electronic device 100 according to an embodiment may include the bracket 130, the flexible display 160, the flexible display support member 170, the heat radiating sheet 180, and the roll bar 193.

In an embodiment, the rollable portion 165 of the flexible display 160 may be configured to move while being deformed in response to a change of state of the electronic device 100. In an operation in which a state of the electronic device 100 is changed, the rollable portion 165 may move along the roll bar 193 and may be partially deformed. For example, a portion of the rollable portion 165 that surrounds the roll bar 193 may substantially form a curved surface, and the remaining portion may substantially form a flat surface.

In an embodiment, at least a portion of the roll bar 193 may be formed to be a curved surface 193a such that the flexible display 160, the heat radiating sheet 180, and the flexible display support member 170 move while forming a curved path along the roll bar 193. For example, the surface of the roll bar 193 with which the flexible display support member 170 makes contact may be formed to be the curved surface 193a. The curved surface 193a of the roll bar 193 may be surrounded by the flexible display support member 170. The curved surface 193a of the roll bar 193 may be formed to have a specified radius of curvature R. For example, at least portions of the flexible display 160, the heat radiating sheet 180, and the flexible display support member 170 may form a curved path having the center of curvature CP of the curved surface 193a as the center thereof.

In an embodiment, the flexible display support member 170 may be disposed to surround the curved surface 193a of the roll bar 193. For example, the flexible display support member 170 may have a shape in which at least a portion is bent while forming a curved path along the curved surface of the roll bar 193. At least some of the plurality of support bars 171 of the flexible display support member 170 may make contact with the curved surface 193a of the roll bar 193.

In an embodiment, the flexible display support member 170 may be configured such that the gaps between the plurality of support bars 171 are changed in response to an operation in which the rollable portion 165 is deformed from a curved surface to a flat surface or from a flat surface to a curved surface. For example, the gaps between the plurality of support bars 171 of the flexible display support member 170 may differ from each other on the curved section and the flat section of the rollable portion 165.

In an embodiment, referring to FIG. 6B together, on the flat section of the rollable portion 165, the gap between the upper surfaces of the plurality of adjacent support bars 171 (e.g., the fourth surfaces 174 of FIGS. 6A and 6B) may be the second gap G2, the gap between the lower surfaces of the plurality of adjacent support bars 171 (e.g., the third surfaces 173 of FIGS. 6A and 6B) may be the first gap G1, and the gap between the side surfaces of the plurality of adjacent support bars 171 (e.g., the fifth surfaces 175 and the sixth surfaces 176 of FIGS. 6A and 6B) may be the third gap G3. As some of the plurality of support bars 171 make contact with the curved surface 193a of the roll bar 193 on the curved section of the rollable portion 165, the gap between the upper surfaces of the plurality of adjacent support bars 171 may be narrower than the second gap G2, the gap between the bottom surfaces of the plurality of adjacent support bars 171 may be wider than the first gap G1, and the gap between the side surfaces of the plurality of adjacent support bars 171 may be wider than the third gap G3. For example, the gap between the lower surfaces of the plurality of adjacent support bars 171 may be a fourth gap G4 wider than the first gap G1, the gap between the upper surfaces of the plurality of adjacent support bars 171 may be a fifth gap G5 narrower than the second gap G2, and the gap between the side surfaces of the plurality of adjacent support bars 171 may be a sixth gap G6 wider than the third gap G3.

In embodiments of the disclosure, the gaps between the plurality of support bars 171 of the flexible display support member 170 may be changed in response to movement and/or deformation of the rollable portion 165 when a state of the electronic device 100 is changed depending on a sliding motion of a second housing (e.g., the second housing 150 of FIGS. 1 to 4). Accordingly, the shape of the heat radiating sheet 180 to which the plurality of support bars 171 are attached may be deformed.

In an embodiment, the heat radiating sheet 180 may be configured to be deformed in response to an operation in which the rollable portion 165 of the flexible display 160 is deformed from a curved surface to a flat surface or from a flat surface to a curved surface. For example, the heights H4 and H5 of the plurality of folding portions 184 of the heat radiating sheet 180 may differ from each other on the curved section and the flat section of the rollable portion 165.

In an embodiment, the height of the plurality of folding portions 184 may be a fourth height H4 on the flat section of the rollable portion 165. For example, the height of the plurality of folding portions 184 may refer to the distance (e.g., the first height H1 of FIG. 6A) between the second surface 160b of the flexible display 160 and the peaks 185 of the plurality of folding portions 184. As the gap between the bottom surfaces of the plurality of support bars 171 is increased on the curved section of the rollable portion 165, the plurality of folding portions 184 may be pulled toward the plurality of attachment portions 183 located on the opposite sides of the plurality of folding portions 184. For example, on the curved section of the rollable portion 165, the height of the plurality of folding portions 184 may be a fifth height H5 smaller than the fourth height H4 as the opposite end portions of the plurality of folding portions 184 are pulled in the opposite directions.

In embodiments of the disclosure, the plurality of folding portions 184 of the heat radiating sheet 180 may be deformed in a form in which the height is increased or decreased in response to movement and/or deformation of the rollable portion 165 when a state of the electronic device 100 is changed depending on a sliding motion of the second housing 150. Accordingly, the plurality of folding portions 184 may prevent the heat radiating sheet 180 from being damaged, broken, or stripped by tension.

FIG. 9A is a view illustrating the flexible display support member and the heat radiating sheet of the electronic device according to an embodiment of the disclosure. FIG. 9B is a view illustrating the flexible display support member and the heat radiating sheet of the electronic device according to an embodiment of the disclosure.

Referring to FIGS. 9A and 9B, the electronic device 100 according to an embodiment may include the flexible display 160, the heat radiating sheet 180, and the flexible display support member 170.

In an embodiment, the heat radiating sheet 180 may be attached to portions of the flexible display 160. The flexible display support member 170 may include the plurality of support bars 171 attached to portions of the heat radiating sheet 180. The heat radiating sheet 180 may include the plurality of attachment portions 183 to which the plurality of support bars 171 are attached and the plurality of folding portions 184 located between the plurality of adjacent support bars 171.

FIGS. 9A and 9B may be views illustrating embodiments in which the spacing of the plurality of folding portions 184 of the heat radiating sheet 180 is diversely changed. For example, according to the embodiments illustrated in FIGS. 9A and 9B, the intervals at which the plurality of folding portions 184 are formed may differ from that in the embodiment illustrated in FIG. 6A. Hereinafter, repetitive descriptions will be omitted, and the following description will be focused on the changed portion.

According to the embodiment illustrated in FIG. 9A, the plurality of folding portions 184 may be formed with two support bars 171 therebetween. Two support bars 171 may be attached to each of the plurality of attachment portions 183. For example, the plurality of folding portions 184 may include a first folding portion 184-1 and a second folding portion 184-2, and two support bars 171 may be disposed between the first folding portion 184-1 and the second folding portion 184-2. However, without being limited thereto, the plurality of folding portions 184 may be formed with three or more support bars 171 therebetween.

According to the embodiment illustrated in FIG. 9B, the intervals at which the plurality of folding portions 184 are disposed may differ from each other. For example, some of the plurality of folding portions 184 may be formed with one bar 171 therebetween, and the other folding portions 184 may be formed with two support bars 171 therebetween. One bar 171 may be attached to some of the plurality of attachment portions 183, and two support bars 171 may be attached to the other attachment portions 183. For example, the plurality of folding portions 184 may include a first folding portion 184-1, a second folding portion 184-2, and a third folding portion 184-3, one bar 171 may be disposed between the first folding portion 184-1 and the second folding portion 184-2, and two support bars 171 may be disposed between the second folding portion 184-2 and the third folding portion 184-3.

In embodiments of the disclosure, the intervals at which the plurality of folding portions 184 are disposed may be adjusted based on the flexibility of the heat radiating sheet 180. For example, when the heat radiating sheet 180 is formed of a material having relatively low flexibility, the intervals at which the plurality of folding portions 184 are disposed may be decreased to prevent breakage. In another example, when the heat radiating sheet 180 is formed of a material having relatively high flexibility, the intervals at which the plurality of folding portions 184 are disposed may be increased.

FIG. 10A is a view illustrating the flexible display support member and the heat radiating sheet of the electronic device according to an embodiment of the disclosure. FIG. 10B is a view illustrating the flexible display support member and the heat radiating sheet of the electronic device according to an embodiment of the disclosure.

Referring to FIGS. 10A and 10B, the electronic device 100 according to an embodiment may include the flexible display 160, the heat radiating sheet 180 attached to the flexible display 160, and the flexible display support member 170 attached to the heat radiating sheet 180. The flexible display support member 170 may include a plurality of support bars 171'.

FIGS. 10A and 10B may be views illustrating an embodiment in which the plurality of support bars 171' have a different shape from the plurality of support bars 171 of FIGS. 6A and 6B. Hereinafter, repetitive descriptions will be omitted, and the following description will be focused on the changed portion.

In an embodiment, the plurality of support bars 171' may have a rectangular cross-sectional shape. For example, when the cross-sections of the plurality of support bars 171' are viewed, a third surface 173 and a fourth surface 174 may have the same length, and a fifth surface 175 and a sixth surface 176 may have the same length. The third surfaces 173 of the plurality of support bars 171' may be attached to the plurality of attachment portions 183 of the heat radiating sheet 180.

In an embodiment, the cross-sectional areas of the plurality of support bars 171' may be constant in the direction of the height H of the plurality of support bars 171'. On the flat section of the rollable portion (e.g., the rollable portion 165 of FIGS. 6A and 8) of the flexible display 160, the gap G between the plurality of adjacent support bars 171' may be constant in the direction of the height H. For example, the height H of the plurality of support bars 171' may refer to the distance between the third surfaces 173 and the fourth surfaces 174 of the plurality of support bars 171'.

In an embodiment, the plurality of folding portions 184 of the heat radiating sheet 180 may be located in the spaces separating the fifth surfaces 175 and the sixth surfaces 176 of the plurality of adjacent support bars 171'. For example, the plurality of folding portions 184 of the heat radiating sheet 180 may be formed based on the height H of the plurality of support bars 171', the gap G between the plurality of support bars 171', and the radius of curvature R of the roll bar 193. Hereinafter, a relationship between the length of the plurality of folding portions 184 and the above-described numerical values will be described.

In an embodiment, when the plurality of support bars 171' are formed in a rectangular shape, the plurality of folding portions 184 of the heat radiating sheet 180 may be formed so as not to exceed one half of the height of the plurality of support bars 171'. A relational expression between the length of the plurality of folding portions 184 and the height H and the gap G of the plurality of support bars 171' may be defined by Equation 1 below.

$$A \leq \sqrt{(G/2)^2 + (H/2)^2} \qquad \text{Equation 1}$$

In Equation 1 above, "G" may mean the gap between the plurality of adjacent support bars 171' on the flat section of the rollable portion 165 of the flexible display 160, "A" may mean one half of the entire length of the plurality of folding portions 184, and "H" may mean the height of the plurality of support bars 171'. For example, the distance between a fifth surface 175 of a bar 171'-1 and a sixth surface 176 of a second bar 171'-2 may be defined as "G". The entire length of the plurality of folding portions 184 may be defined as "2A".

According to Equation 1 above, as the plurality of folding portions 184 do not exceed one half of the height H of the plurality of support bars 171', the plurality of folding portions 184 may be prevented from being caught between the plurality of support bars 171'.

In an embodiment, the length of the plurality of folding portions 184 of the heat radiating sheet 180 may be smaller than the length of an arc between the plurality of support bars 171'. A relational expression between the length of the plurality of folding portions 184 and the length of the arc may be defined by Equation 2 below.

$$2A < B\left(B = 2\pi R \times \frac{\theta}{360}\right) \qquad \text{Equation 2}$$

In Equation 2 above, "B" may mean the length of an arc formed by the plurality of adjacent support bars 171' on the curved section of the rollable portion 165. "R" may mean the radius of curvature of the roll bar 193 (e.g., the radius of curvature R of FIG. 8). "θ" may mean the central angle. For example, in the state in which the rollable portion 165 is curved, a first corner 178 at which the third surface 173 and the fifth surface 175 of the first bar 171'-1 meet each other, a second corner 179 at which the third surface 173 and the sixth surface 176 of the second bar 171'-2 meet each other, and the center point CP of the roll bar 193 (e.g., the center point CP of FIG. 8) may form a sector having a radius of R and a central angle of θ. "B" may be understood as the length of the arc of the sector.

According to Equation 2 above, as the entire length 2A of the plurality of folding portions 184 is smaller than the length B of the arc between the plurality of support bars 171', the plurality of folding portions 184 may be prevented from being torn by tension when the gap between the plurality of support bars 171' is increased.

FIG. 11 is a view illustrating the second state of the electronic device according to an embodiment of the disclosure. FIG. 12 is a view illustrating a heat radiating path of the electronic device according to an embodiment of the disclosure.

FIG. 12 may be a sectional view of the electronic device 100 taken along line C-C' illustrated in FIG. 11.

Referring to FIGS. 11 and 12, the electronic device 100 according to an embodiment may include the first housing 110, the second housing 150, the flexible display 160, the flexible display support member 170, the heat radiating sheet 180, the circuit board 194, and a heat radiating structure 198.

FIGS. 11 and 12 may be views illustrating the electronic device 100 further including the heat radiating structure 198. Some of the components of the electronic device 100 illustrated in FIGS. 11 and 12 may be identical or similar to some of the components of the electronic device 100 described with reference to FIGS. 1 to 5, 6A, 6B, 7, and 8, and repetitive descriptions will hereinafter be omitted.

In an embodiment, the circuit board 194 may be disposed on the first housing 110. A heat generating component 199 may be disposed on one surface of the circuit board 194. For example, the heat generating component 199 may be disposed on one surface (e.g., the surface facing the +z-axis direction) of the circuit board 194 so as to be located between the circuit board 194 and the bracket 130.

In an embodiment, the heat generating component 199 may be electrically connected with the circuit board 194 through solder balls 194*a*. For example, the solder balls 194*a* may be disposed between the heat generating component 199 and the circuit board 194. The heat generating component 199 may be a main heat generating source of the electronic device 100. For example, the heat generating component 199 may include an application processor (AP), an IC chip, or a chipset.

In an embodiment, a shield-can 197 surrounding a portion of the heat generating component 199 may be disposed on the one surface of the circuit board 194. The shield-can 197 may be disposed between the circuit board 194 and the bracket 130. For example, the heat generating component 199, the solder balls 194*a*, and a thermal interface material (TIM) 198*a* may be accommodated in the shield-can 197. The shield-can 197 may be formed in a form in which an upper portion is open to expose at least a portion of the TIM 198*a*.

In an embodiment, the heat radiating structure 198 may include the TIM 198*a*, a heat conduction sheet 198*b*, and a vapor chamber 198*c*.

In an embodiment, the TIM 198*a* may be disposed on the top of the heat generating component 199 (e.g., in the +z-axis direction). For example, the TIM 198*a* may be located between the heat generating component 199 and the bracket 130 to diffuse or move heat generated from the heat generating component 199 toward the bracket 130. The TIM 198*a* may be attached to the upper surface (e.g., the surface facing the +z-axis direction) of the heat generating component 199. The TIM 198*a* may be exposed outside the shield-can 197 through the opening region of the shield-can 197.

In an embodiment, the heat conduction sheet 198*b* may be located between the bracket 130 and the shield-can 197. The heat conduction sheet 198*b* may be attached to the shield-can 197 or the bracket 130 to make contact with the TIM 198*a* and the vapor chamber 198*c*. For example, opposite surfaces of the heat conduction sheet 198*b* may make contact with the TIM 198*a* and the vapor chamber 198*c* to enable heat conduction or heat transfer between the TIM 198*a* and the vapor chamber 198*c*. The heat conduction sheet 198*b* may be formed of a material similar to that of the heat radiating sheet 180. For example, the heat conduction sheet 198*b* may include a graphite sheet. However, the material of the heat conduction sheet 198*b* is not limited to the above-described example, and the heat conduction sheet 198*b* may be formed of a metallic material including a copper (Cu) sheet, an aluminum (Al) sheet, and/or a stainless steel sheet.

In an embodiment, the vapor chamber 198*c* may be disposed between the bracket 130 and the heat conduction sheet 198*b*. The vapor chamber 198*c* may be filled with a refrigerant member and may be configured to provide a heat radiating function through a phase change of the refrigerant member. For example, heat may be transferred from a high-temperature portion (e.g., the heat generating component 199) to a low-temperature portion of the electronic device 100 by a phase change in which the refrigerant member is gasified or liquefied by heat transferred from the heat generating component 199.

In an embodiment, the vapor chamber 198*c* may diffuse or move heat transferred from the heat conduction sheet 198*b* toward the bracket 130. In various embodiments, the vapor chamber 198*c* may extend in the lengthwise direction of the electronic device 100 such that heat generated from the heat generating component 199 is transferred in the lengthwise direction of the electronic device 100 (e.g., the y-axis direction). For example, the vapor chamber 198*c* may be configured to provide a path along which heat generated from the heat generating component 199 moves in a third direction D3 and a fourth direction D4 that are perpendicular to the sliding directions D1 and D2 of the second housing 150 and parallel to the circuit board 194.

In an embodiment, heat generated from the heat generating component 199 may move outside the electronic device 100 through the TIM 198*a*, the heat conduction sheet 198*b*, the vapor chamber 198*c*, the bracket 130, the heat radiating sheet 180, and the flexible display 160. For example, a portion of heat generated from the heat generating component 199 may move in a direction (e.g., the +z-axis direction) perpendicular to the circuit board 194 and may be diffused outside the electronic device 100 via the TIM 198*a*, the heat conduction sheet 198*b*, the vapor chamber 198*c*, the bracket 130, the heat radiating sheet 180, and the flexible display 160. In another example, a portion of heat generated from the heat generating component 199 may be transferred to the heat radiating sheet 180 through the TIM 198*a*, the heat conduction sheet 198*b*, the vapor chamber 198*c*, and the bracket 130 and thereafter may move in the first direction D1 along the heat radiating sheet 180 to diffuse into the expanded region of the electronic device 100.

In an embodiment, the heat radiating sheet 180 may be formed to have high thermal conductivity or thermal diffusivity in the sliding directions D1 and D2 of the second housing 150 (e.g., the x-axis direction). For example, the thermal conductivity of the heat radiating sheet 180 in the x-axis direction may be higher than the thermal conductivity of the heat radiating sheet 180 in the y-axis direction. However, the direction in which the thermal conductivity of the heat radiating sheet 180 is high is not limited to the above-described example.

In various embodiments, the heat radiating sheet 180 may be configured such that the first portion 181 overlapping the base portion 164 and the second portion 182 overlapping the rollable portion 165 easily perform heat conduction in different directions. For example, the second portion 182 may be formed to have high thermal conductivity in the first direction D1 and/or the second direction D2, and the first portion 181 may be formed to have high thermal conductivity in the y-axis direction (e.g., the third direction D3 and/or the fourth direction D4) perpendicular to the x-axis and the z-axis. The directions of heat conduction of the first portion 181 and the second portion 182 may be determined based on the extension or arrangement directions of internal particles of the first portion 181 and the second portion 182.

In an embodiment, a vent hole 156 that fluidly connects the inner space of the second housing 150 (e.g., the inner space 155 of FIGS. 3 and 4) with the outside may be formed in the second housing 150. For example, the vent hole 156 connected with the inner space 155 of the second housing 150 surrounded by the flexible display 160 may be formed in at least one of the fourth sidewall 152 or the fifth sidewall 153 of the second housing 150. The electronic device 100 according to the illustrated embodiment has a structure in which the base portion 164 of the flexible display 160 is fixed to the first housing 110 and the rollable portion 165 moves into or out of the second housing 150. However, according to various embodiments, the electronic device 100 may be changed to a structure in which the base portion 164 of the flexible display 160 is coupled to move together with the second housing 150 and the rollable portion 165 moves into or out of the first housing 110. In this case, the flexible display support member 170 supporting the rollable portion 165 may be located in the first housing 110, and the vent hole 156 may be formed in the first housing 110 to enable an air flow into the inner space of the first housing 110.

In an embodiment, the vent hole 156 may provide a passage through which air moves between the outside of the second housing 150 and the inner space 155 of the second housing 150 when the electronic device 100 is in an expanded state (e.g., the second state). For example, air outside the electronic device 100 may move into the inner space 155 through the vent hole 156, and air in the inner space 155 may move outside the electronic device 100 through the vent hole 156. Accordingly, a heat radiating effect by the heat radiating sheet 180 disposed on the rollable portion 165 may be increased.

In an embodiment, as the heat radiating sheet 180 includes the plurality of folding portions 184, the area by which the heat radiating sheet 180 makes contact with air may be increased, and thus a heat radiating effect may be improved. Furthermore, as the heat radiating sheet 180 includes the plurality of folding portions 184, a predetermined flow space S may be formed between the plurality of folding portions 184 and the flexible display 160 (or, the reinforcing sheet 196). Air is able to flow through the flow space S, and thus a heat radiating effect may be improved. For example, air outside the electronic device 100 may be introduced into the inner space 155 of the second housing 150 through the vent hole 156, and the introduced air may diffuse heat while flowing through the flow space S formed between the heat radiating sheet 180 and the flexible display 160 by the plurality of folding portions 184.

FIG. 13A is a view illustrating temperature distributions of electronic devices including heat radiating sheets according to an embodiment of the disclosure. FIG. 13B is a view illustrating a temperature distribution of an electronic device after a life test is performed on the electronic device according to an embodiment of the disclosure.

FIGS. 13A and 13B may be photos obtained by measuring temperature using infrared light when the electronic devices 100 and 200 of the various embodiments are in a second state (e.g., the state of FIG. 12).

Referring to FIG. 13A, the temperature distributions of the electronic devices 100 and 200 according to an embodiment may differ from each other, based on the forms and/or structures of the heat radiating sheets (e.g., the heat radiating sheet 180 of FIG. 12). The first electronic device 100 may have a structure in which a heat radiating sheet 180 extends to an expanded portion 105, and the second electronic device 200 may have a structure in which a heat radiating sheet 180 does not extend to an expanded portion 205.

The first electronic device 100 of FIG. 13A may be referred to as the electronic device 100 illustrated in FIGS. 11 and 12 and may be understood as including the heat radiating sheet 180 extending to the rollable portion 165 of the flexible display 160. For example, the heat radiating sheet 180 included in the electronic device 100 of FIG. 13A may have a structure in which a plurality of folding portions (e.g., the plurality of folding portions 184 of FIG. 12) are formed. Unlike in the first electronic device 100, in the second electronic device 200 of FIG. 13A, the heat radiating sheet 180 may be understood as being disposed only on the base portion 164 without extending to the rollable portion 165 of the flexible display 160 in the electronic device 100 illustrated in FIGS. 11 and 12.

The heat measurement results illustrated in FIG. 13A may be results measured based on temperatures when a specified period of time elapses after the same application causing the maximum load of a terminal is executed on the first electronic device 100 and the second electronic device 200. However, a heat measurement method is not limited to the above-described example, and measurement may be performed in various ways.

In an embodiment, as the heat radiating sheet 180 of the first electronic device 100 extends to the expanded portion 105, when the first electronic device 100 is in an expanded state (e.g., the second state), a path along which heat generated from a heat generating portion 101 (e.g., a hot spot) is diffused (or, dispersed) to the expanded portion 105 may be provided. Accordingly, the temperature of the heat generating portion 101 of the first electronic device 100 may be lowered. For example, the temperature of the heat generating portion 101 of the first electronic device 100 may be about 56.6° C., and the temperature of a first point 103 of the expanded portion 105 may be about 43.0° C. The numerical values for the temperatures are illustrative, and the temperatures are not limited thereto.

In an embodiment, as the heat radiating sheet 180 of the second electronic device 200 is not disposed in the expanded portion 205, when the second electronic device 200 is in an expanded state (e.g., the second state), there may be a limitation in diffusing heat generated from a heat generating portion 201 to the expanded portion 205. Accordingly, the temperature of the heat generating portion 201 of the second electronic device 200 may remain high. For example, the temperature of the heat generating portion 201 of the second electronic device 200 may be about 58.8° C., and the temperature of a second point 203 of the expanded portion 205 may be about 37.1° C. The numerical values for the temperatures are illustrative, and the temperatures are not limited thereto.

It can be seen that when the heat radiating sheet 180 extends to the expanded portion 105 as illustrated in FIG. 13A, the temperatures of the heat generating portions 101 and 201 are decreased by about 2.2° C., as compared with when the heat radiating sheet 180 does not exist in the expanded portion 205 illustrated in FIG. 13B.

Referring to FIG. 13B, the heat radiating sheet 180 included in the first electronic device 100 may include the plurality of folding portions 184 and thus may be prevented from being broken and/or stripped by deformation of the first electronic device 100.

The first electronic device 100 illustrated in FIG. 13B may be in a state in which a life test (or, a reliability test) is performed based on the first electronic device 100 illustrated in FIG. 13A. The life test may be a test for identifying or checking the lifetime of the heat radiating sheet 180 in response to a deformation operation in which the first electronic device 100 is expanded or reduced. For example, FIG. 13B illustrates a temperature distribution depending on a heat measurement result of the first electronic device 100 after a sliding motion for a change of state of the first electronic device 100 is performed about 200,000 times. However, a life test method is not limited to the above-described example and may be performed in various ways.

In an embodiment, when the first electronic device 100 after the performance of the life test is in an expanded state (e.g., the second state), the heat radiating sheet 180 may not be broken/stripped, and heat generated from the heat generating portion 101 may be diffused (or, dispersed) to the expanded portion 105. For example, the temperature of the heat generating portion 101 of the first electronic device 100 on which the life test is performed may be about 55.2° C., and the temperature of the first point 103 of the expanded portion 105 may be about 42.3° C.

As illustrated in FIG. 13B, the heat radiating sheet 180 may include the plurality of folding portions 184 deformable depending on a change of state of the first electronic device 100, and thus degradation in heat radiating performance by breakage/stripping of the heat radiating sheet 180 may not occur.

FIG. 14 is a view illustrating a manufacturing method of a heat radiating sheet according to an embodiment of the disclosure.

Referring to FIG. 14, the heat radiating sheet 310 according to an embodiment may be manufactured through a thermal processing process 300 such that a plurality of folding portions 311 are formed. However, the manufacturing process 300 of the heat radiating sheet 310 illustrated in FIG. 14 is illustrative, and without being limited thereto, the heat radiating sheet 310 may be manufactured through various commonly used processes.

According to an embodiment, the heat radiating sheet 310 may be manufactured through a hot-press process 300 using press molds 320 and 330. For example, the press molds 320 and 330 may include the first mold 320 (e.g., an upper mold) and the second mold 330 (e.g., a lower mold). A plurality of protrusions 321 may be formed on the first mold 320, and a plurality of recesses 331 corresponding to the plurality of protrusions 321 may be formed on the second mold 330.

In an embodiment, the heat radiating sheet 310 may be manufactured in a form in which a graphite film and a PEN film are laminated and may be seated on the second mold 330. After the heat radiating sheet 310 is disposed on the second mold 330, the first mold 320 may move down toward the second mold 330 to press the heat radiating sheet 310, and thus the plurality of folding portions 311 having a desired shape may be formed in the heat radiating sheet 310.

The manufacturing process 300 of FIG. 14 may form the plurality of folding portions 311 having a low height in the heat radiating sheet 310 by using heat. For example, when pressing the heat radiating sheet 310, the first mold 320 and the second mold 330 may be in a state of being heated to a predetermined temperature. In another example, when seated on the second mold 330, the heat radiating sheet 310 may be in a state of being heated to a predetermined temperature.

In an embodiment, the plurality of protrusions 321 and the plurality of recesses 331 may form the plurality of folding portions 311 in the heat radiating sheet 310. For example, the number, shape, spacing, height, or depth of the plurality of protrusions 321 and/or the plurality of recesses 331 may be configured to correspond to the plurality of folding portions 311.

FIG. 15A is a view illustrating a front side of an electronic device according to an embodiment of the disclosure. FIG. 15B is a view illustrating a rear side of the electronic device according to an embodiment of the disclosure.

FIGS. 15A and 15B may be views for describing an embodiment in which the flexible display support member 170 and the heat radiating sheet 180 of the electronic device 100 described with reference to FIGS. 6A and 6B are applied to the electronic device 400 having a different form. For example, the electronic device 400 of FIGS. 15A and 15B may have a different form from the electronic device 100 of FIGS. 1 to 4.

Referring to FIGS. 15A and 15B, the electronic device 400 according to an embodiment may include a housing 410, a flexible display module 420, a roller 460, and a holder 470.

The electronic device 400 according to an embodiment may be a rollable electronic device in which an exposed region of the flexible display module 420 exposed outside the housing 410 is expanded or reduced by moving at least a portion of the flexible display module 420 into or out of the housing 410 by a user operation and/or a mechanical operation (e.g., driving a motor). For example, the flexible display module 420 may be configured to move into the housing 410 while being rolled around the roller 460 disposed in the housing 410 and move out of the housing 410 while being unrolled from the roller 460.

In an embodiment, the electronic device 400 may include a first state 401 (e.g., a rolled state, a reduced state, or a closed state) and a second state 403 (e.g., an unrolled state, an expanded state, or an open state).

In an embodiment, the first state 401 may be defined as a state in which the exposed region of the flexible display module 420 exposed outside the electronic device 400 has a minimum size. For example, the first state 401 may be a state in which the flexible display module 420 is rolled about an axis of rotation R to the maximum. In another example, the first state 401 may be a state in which the flexible display module 420 can no longer move toward the inside of the housing 410.

According to the illustrated embodiment, in the first state 401, at least a portion of the flexible display module 420 may be exposed outside the housing 410. However, the first state 401 of the electronic device 400 is not limited to the illustrated embodiment, and according to various embodiments, in the first state 401, the flexible display module 420 may be completely accommodated in the housing 410 so as not to be exposed outside the housing 410.

In an embodiment, the second state 403 may be defined as a state in which the exposed region of the flexible display module 420 exposed outside the housing 410 has a maximum size. For example, the second state 403 may be a state in which the flexible display module 420 is unrolled about the axis of rotation R to the maximum. In another example, the second state 403 may be a state in which the flexible display module 420 can no longer move toward the outside of the housing 410. The electronic device 400 may be configured to provide a display area relatively expanded as the electronic device 400 is changed from the first state 401 to the second state 403.

In an embodiment, the electronic device 400 may further include a third state 402 (e.g., a free stop state) that is an intermediate state defined between the first state 401 and the second state 403. The size of the flexible display module 420 exposed outside the housing 410 in the third state 402 may be larger than that in the first state 401 and smaller than that in the second state 403. For example, the electronic device 400 may be changed from the first state 401 to the second state 403 through the third state 402, or may be changed from the second state 403 to the first state 401 through the third state 402.

In an embodiment, when a signal is generated through an input module (e.g., a button) included in the electronic device 400, the electronic device 400 may be changed from the first state 401 to the second state 403 or from the second state 403 to the first state 401 by a drive device (e.g., a motor) connected with the flexible display module 420 or the roller (e.g., the second housing 150 of FIG. 3). For example, when a signal is generated through a hardware button or a software button provided through a screen, the electronic device 400 may be changed from the first state 401 to the second state 403 or from the second state 403 to the first state 401.

In an embodiment, when signals are generated from various sensors (e.g., a pressure sensor) included in the electronic device 400, the electronic device 400 may be changed from the first state 401 to the second state 403 or from the second state 403 to the first state 401. For example, when a user carries or grasps the electronic device 400 with a hand, a squeeze gesture of pressing a specified section (or, region) of the electronic device 400 by part of the hand (e.g., a palm or a finger) may be sensed through the sensor, and the electronic device 400 may be changed from the first state 401 to the second state 403 or from the second state 403 to the first state 401 accordingly.

In an embodiment, the housing 410 may form the exterior of the electronic device 400. The housing 410 may be formed in a hollow structure such that other components (e.g., the flexible display module 420 or the roller 460) of the electronic device 400 are accommodated in the housing 410. An opening 411 through which the flexible display module 420 moves toward the inside or the outside of the housing 410 may be formed in the outer surface of the housing 410. In the illustrated embodiment, the housing 410 may be formed in a substantially cylindrical shape. However, the shape of the housing 410 is not limited thereto. The housing 410 may be formed in various shapes. For example, the housing 410 may have a cylindrical shape, a rectangular (or, rod) shape, or a rounded rectangular shape.

In an embodiment, the flexible display module 420 may move into or out of the housing 410 through the opening 411. For example, depending on the direction of rotation of the roller 460, at least a portion of the flexible display module 420 may move into the housing 410 while being rolled around the roller 460, or at least a portion of the flexible display module 420 may move out of the housing 410 while being unrolled from the roller 460. The flexible display module 420 may include a flexible display.

In an embodiment, the flexible display module 420 may include a flexible display 430, a flexible display support member 440 supporting the flexible display 430, and a heat radiating sheet 450 disposed between the flexible display 430 and the flexible display support member 440.

In an embodiment, the flexible display support member 440, together with the flexible display 430, may be rolled or unrolled about the axis of rotation R. For example, the flexible display support member 440 may be formed of a multi-joint rail, a multi-joint module, or a multi-bar that includes a plurality of support bars 442. The flexible display support member 440 may perform a function of supporting the flexible display 430 such that the flexible display 430 located outside the housing 410 remains flat.

In an embodiment, the heat radiating sheet 450 may be attached to the rear surface of the flexible display 430 (e.g., the surface facing the −z-axis direction based on the second state 403 of FIGS. 15A and 15B). For example, the heat radiating sheet 450 may be attached to the rear surface of the flexible display 430 through a plurality of first adhesive members 481, and the plurality of support bars 442 of the flexible display support member 440 may be attached to the heat radiating sheet 450 through a plurality of second adhesive members 482.

In an embodiment, the heat radiating sheet 450 may include a plurality of folding portions 452 at least partially located between the plurality of support bars 442. The heat radiating sheet 450 may contain a flexible material. Accordingly, the plurality of folding portions 451 of the heat radiating sheet 450 may be configured to be deformed in response to an operation in which the flexible display module 420 is rolled around the roller 460 or unrolled from the roller 460.

In an embodiment, the flexible display 430, the flexible display support member 440, and the heat radiating sheet 450 of the flexible display module 420 may be referred to as the flexible display 160, the flexible display support member 170, and the heat radiating sheet 180 of FIG. 6A, respectively. For example, the contents described in relation to the flexible display 160, the flexible display support member 170, and/or the heat radiating sheet 180 may be identically applied to the flexible display 430, the flexible display support member 440, and/or the heat radiating sheet 450 of FIGS. 15A and 15B. Although not illustrated, the flexible display module 420 may further include a reinforcing sheet (e.g., the reinforcing sheet 196 of FIG. 7) disposed between the heat radiating sheet 450 and the flexible display 430. The structure of the reinforcing sheet 196 (e.g., the lattice pattern 1961 of FIG. 7) and/or the relationship between the reinforcing sheet 196 and the heat radiating sheet 450 may be the same as the contents described with reference to FIG. 7.

In an embodiment, the roller 460 may be disposed in the housing 410 so as to be rotatable. For example, the roller 460 may be coupled to the inside surface of the housing 410 so as to be rotatable about the axis of rotation R. The roller 460 may be connected or coupled with the flexible display module 420 such that the flexible display module 420 is rolled or unrolled by a rotary motion of the roller 460.

In an embodiment, the holder 470 may be disposed on one end portion of the flexible display module 420. The holder 470, together with the flexible display module 420, may move in the direction of movement of the flexible display module 420 (e.g., the x-axis direction). The holder 470 may be formed to be long in a direction (e.g., the y-axis direction) parallel to the axis of rotation R. The holder 470 may be configured to be stopped by at least a portion of the housing 410 such that the flexible display module 420 is not completely rolled and moved into the housing 410. For example, the holder 470 may be stopped by the opening 411 of the housing 410, and thus movement of the holder 470 into the housing 410 may be limited. In various embodiments, the user may grasp the holder 470 and may move the flexible display module 420 out of the housing 410.

FIG. 16 is a block diagram illustrating an electronic device in a network environment according to an embodiment of the disclosure.

Referring to FIG. 16, an electronic device 501 in a network environment 500 may communicate with an electronic device 502 via a first network 598 (e.g., a short-range wireless communication network), or an electronic device 504 or a server 508 via a second network 599 (e.g., a long-range wireless communication network). According to an embodiment, the electronic device 501 may communicate with the electronic device 504 via the server 508. According to an embodiment, the electronic device 501 may include a processor 520, memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597. In some embodiments, at least one (e.g., the display device 560 or the camera module 580) of the components may be omitted from the electronic device 501, or one or more other components may be added in the electronic device 501. In some embodiments, some of the components may be implemented as single integrated circuitry. For example, the sensor module 576 (e.g., a fingerprint sensor, an iris sensor, or an illuminance sensor) may be implemented as embedded in the display device 560 (e.g., a display).

The processor 520 may execute, for example, software (e.g., a program 540) to control at least one other component (e.g., a hardware or software component) of the electronic device 501 coupled with the processor 520, and may perform various data processing or computation. According to an embodiment, as at least part of the data processing or computation, the processor 520 may load a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a central processing unit (CPU) or an application processor (AP)), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or to be specific to a specified function. The auxiliary processor 523 may be implemented as separate from, or as part of the main processor 521.

The auxiliary processor 523 may control at least some of functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an image signal processor or a communication processor) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data includes, for example, software (e.g., the program 540) and input data or output data for a command related thereto. The memory 530 may include the volatile memory 532 or the non-volatile memory 534. The non-volatile memory 534 may include an internal memory 536 or external memory 538.

The program 540 may be stored in the memory 530 as software, and includes, for example, an operating system (OS) 542, middleware 544, or an application 546.

The input device 550 may receive a command or data to be used by other components (e.g., the processor 520) of the electronic device 501, from the outside (e.g., a user) of the electronic device 501. The input device 550 includes, for example, a microphone, a mouse, a keyboard, or a digital pen (e.g., a stylus pen).

The sound output device 555 may output sound signals to the outside of the electronic device 501. The sound output device 555 includes, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 560 may visually provide information to the outside (e.g., a user) of the electronic device 501. The display device 560 includes, for example, a flexible display, a hologram device, or a projector and control circuitry to control a corresponding one of the display, hologram device, and projector. According to an embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to an embodiment, the audio module 570 may obtain the sound via the input device 550, or output the sound via the sound output device 555 or a headphone of an external electronic device (e.g., an electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 includes, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 includes, for example, a high definition multimedia interface (HDMI), a universal serial bus (USB) interface, a secure digital (SD) card interface, or an audio interface.

A connecting terminal 578 may include a connector via which the electronic device 501 may be physically connected with the external electronic device (e.g., the electronic device 502). According to an embodiment, the connecting terminal 578 includes, for example, an HDMI connector, a USB connector, an SD card connector, or an audio connector (e.g., a headphone connector).

The haptic module 579 may convert an electrical signal into a mechanical stimulus (e.g., a vibration or a movement) or electrical stimulus which may be recognized by a user via his tactile sensation or kinesthetic sensation. According to an embodiment, the haptic module 579 includes, for example, a motor, a piezoelectric element, or an electric stimulator.

The camera module 580 may capture a still image or moving images. According to an embodiment, the camera module 580 may include one or more lenses, image sensors, image signal processors, or flashes.

The power management module 588 may manage power supplied to the electronic device 501. According to an embodiment, the power management module 588 may be implemented as at least part of, for example, a power management integrated circuit (PMIC).

The battery 589 may supply power to at least one component of the electronic device 501. According to an embodiment, the battery 589 includes, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the application processor (AP)) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or infrared data association (IrDA)) or the second network 599 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The wireless communication module 592 may support a fifth generation (5G) network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 592 may support a high-frequency band (e.g., the millimeter wave (mmWave) band) to achieve, e.g., a high data transmission rate. The wireless communication module 592 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 592 may support various requirements specified in the electronic device 501, an external electronic device (e.g., the electronic device 504), or a network system (e.g., the second network 599). According to an embodiment, the wireless communication module 592 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 597 may transmit or receive a signal or power to or from the outside (e.g., the external electronic device) of the electronic device 501. According to an embodiment, the antenna module 597 may include an antenna including a radiating element implemented using a conductive material or a conductive pattern formed in or on a substrate (e.g., PCB). According to an embodiment, the antenna module 597 may include a plurality of antennas. In such a case, at least one antenna appropriate for a communication scheme used in the communication network, such as the first network 598 or the second network 599, may be selected, for example, by the communication module 590 (e.g., the wireless communication module 592) from the plurality of antennas. The signal or the power may then be transmitted or received between the communication module 590 and the external electronic device via the selected at least one antenna. According to an embodiment, another component (e.g., a radio frequency integrated circuit (RFIC)) other than the radiating element may be additionally formed as part of the antenna module 597.

According to certain embodiments, the antenna module 597 may form a mmWave antenna module. According to an embodiment, the mm Wave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 501 and the external electronic device 504 via the server 508 coupled with the second network 599. Each of the electronic devices 502 and 504 may be a device of a same type as, or a different type, from the electronic device 501. According to an embodiment, all or some of operations to be executed at the electronic device 501 may be executed at one or more of the external electronic devices 502 or 504, or the server 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example. The electronic device 501 may provide ultra-low-latency services using, e.g., distributed computing or mobile edge computing. In another embodiment, the external electronic device 504 may include an internet-of-things (IOT) device. The server 508 may be an intelligent server using machine learning and/or a neural network. According to an embodiment, the external electronic device 504 or the server 508 may be included in the second network 599. The electronic device 501 may be applied to intelligent services (e.g., smart home, smart city, smart car, or healthcare) based on 5G communication technology or IoT-related technology.

An electronic device 501 according to an embodiment of the disclosure may include a first housing 110, a second housing 150 disposed to slide relative to the first housing, a flexible display 160 configured such that a size of a region exposed on a front side of the electronic device is changed in response to a sliding motion of the second housing relative to the first housing, a heat radiating sheet 180 disposed on at least a portion of a rear surface of the flexible display, and a flexible display support member 170 disposed on a portion of a rear surface of the heat radiating sheet to support a portion of the flexible display. The flexible display support member may include a plurality of support bars 171 that extend in a direction perpendicular to sliding directions D1 and D2 of the second housing. The plurality of support bars may be spaced apart from each other by a gap. The heat radiating sheet may include a plurality of folding portions 184, and at least portions of the heat radiating sheet may be located in spaces separating the plurality of support bars.

In an embodiment, the heat radiating sheet may further include a plurality of attachment portions 183 attached with the plurality of support bars and the rear surface of the flexible display. The plurality of folding portions may be disposed between the plurality of attachment portions adjacent to each other. A partial section (e.g., the second portion 182) of the heat radiating sheet may be formed in a film form in which the plurality of folding portions and the plurality of attachment portions are continuously connected.

In an embodiment, the partial section of the heat radiating sheet may be formed in a shape in which the plurality of attachment portions alternate with the plurality of folding portions in the sliding directions.

In an embodiment, the plurality of folding portions may extend from the plurality of adjacent attachment portions toward the spaces separating the plurality of support bars such that at least portions of the folding portions are located in the spaces separating the plurality of support bars.

In an embodiment, the plurality of folding portions may not be attached with the rear surface of the flexible display.

In an embodiment, the electronic device may further include a reinforcing sheet 196 disposed between the heat radiating sheet and the flexible display. The reinforcing sheet may include a plurality of first portions 196a attached to the plurality of attachment portions and a plurality of second portions 196b disposed between the plurality of first portions and having a lattice pattern 1961 formed therein. The plurality of second portions may overlap the plurality of folding portions.

In an embodiment, the plurality of folding portions may be configured to be partially deformed in response to the sliding motion of the second housing.

In an embodiment, the plurality of folding portions may be formed in a pointed shape to have peaks 185 located in higher positions than the plurality of attachment portions and may be deformed in a form in which a distance between the peaks and the rear surface of the flexible display is increased or decreased depending on the sliding motion.

In an embodiment, each of the plurality of support bars may include a lower surface 173 attached to the heat radiating sheet, an upper surface 174 facing away from the lower surface, and a first side surface 175 and a second side surface 176 that connect the upper surface and the lower surface and face away from each other. Portions of the plurality of folding portions may be accommodated in spaces between the first side surfaces and the second side surfaces of the plurality of support bars disposed adjacent to each other.

In an embodiment, each of the plurality of support bars may be formed in a shape in which a length of the upper surface in the sliding direction is shorter than a length of the lower surface in the sliding direction and the first side surface and the second side surface extend from the upper surface and the lower surface so as to be rounded. When cross-sections of the plurality of support bars are viewed, first points P1 and second points P2 located at outermost positions on the first side surfaces and the second side surfaces may be defined. The plurality of folding portions may be configured such that peaks of the plurality of folding portions are located at a same height as the first points and the second points or at a height lower than the first points and the second points.

In an embodiment, each of the plurality of support bars may be formed such that the first side surface and the second side surface connect the upper surface and the lower surface in a flat form. When cross-sections of the plurality of support bars are viewed, a distance between the upper surface and the lower surface may be defined as a height of the plurality of support bars. The plurality of folding portions may be configured such that peaks of the plurality of folding portions are located at a height lower than or equal to one half of the height of the plurality of support bars.

In an embodiment, the flexible display may include a base portion 164, a shape of which is maintained, the base portion being configured to form the front side of the electronic device and a rollable portion 165 extending from the base portion and configured such that at least a portion is deformed to be flat or curved in response to the sliding motion of the second housing. The heat radiating sheet may include a first portion 181 attached to the rear surface of the base portion and a second portion 182 attached to the rear surface of the rollable portion. The plurality of folding portions may be formed in the second portion.

In an embodiment, the first housing may include a bracket 130 that supports the base portion of the flexible display. The bracket may include a first surface 131 on which the first portion of the heat radiating sheet is disposed and a second surface 132 that faces away from the first surface and on which a circuit board 194 or a battery 195 is supported.

In an embodiment, the electronic device may further include a heat generating component 199 disposed on one surface of the circuit board and a heat radiating structure 198 that overlaps at least a partial region of the first portion of the heat radiating sheet in a direction perpendicular to the one surface of the circuit board. The heat radiating structure may be disposed between the heat generating component and the bracket and may be configured to diffuse heat generated from the heat generating component in a direction substantially perpendicular to the front side.

An electronic device 400 according to an embodiment of the disclosure may include a housing 410 having an opening 411 formed on one side thereof, a roller 460 coupled to an inside of the housing so as to be rotatable, and a flexible display module 430 that is connected to the roller at one end portion thereof and rolled around or unrolled from the roller depending on a direction of rotation of the roller and that moves into or out of the housing through the opening. The flexible display module may include a flexible display 430, a heat radiating sheet 450 disposed on at least a portion of a rear surface of the flexible display, and a flexible display support member 440 disposed on at least a portion of a rear surface of the heat radiating sheet to support the flexible display. The flexible display support member may include a plurality of support bars 442 that extend in a direction substantially parallel to the roller. The plurality of support bars may be spaced apart from each other by a gap. The heat radiating sheet may include a plurality of attachment portions 183 to which the plurality of support bars and the rear surface of the flexible display are attached and a plurality of folding portions 451 disposed between the plurality of attachment portions adjacent to each other. The plurality of folding portions thereof may be configured such that at least portions thereof are located in spaces separating the plurality of support bars.

In an embodiment, the heat radiating sheet may be formed in a shape in which the plurality of attachment portions alternate with the plurality of folding portions.

In an embodiment, the plurality of folding portions may extend from the plurality of attachment portions toward the spaces separating the plurality of support bars such that the at least the portions thereof are located in the spaces separating the plurality of support bars.

In an embodiment, the plurality of folding portions may not be attached with the rear surface of the flexible display.

In an embodiment, the flexible display module may further include a reinforcing sheet 196 disposed between the heat radiating sheet and the flexible display. The reinforcing sheet may include a plurality of first portions 196a attached to the plurality of attachment portions and a plurality of second portions 196b disposed between the plurality of first portions and having a lattice pattern 1961 formed therein. The plurality of second portions may overlap the plurality of folding portions.

In an embodiment, the plurality of folding portions may be formed in a pointed shape to have peaks 185 located in higher positions than the plurality of attachment portions and may be deformed in a form in which a distance between the peaks and the rear surface of the flexible display is increased or decreased depending on an operation in which the flexible display module is rolled around or unrolled from the roller.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first housing;
a second housing disposed to slide relative to the first housing;
a flexible display configured such that a size of a region exposed on a front side of the electronic device is changed in response to a sliding motion of the second housing relative to the first housing;
a heat radiating sheet disposed on at least a portion of a rear surface of the flexible display; and
a flexible display support member disposed on a portion of a rear surface of the heat radiating sheet to support a portion of the flexible display,
wherein the flexible display support member includes a plurality of support bars configured to extend in a direction perpendicular to a sliding direction of the second housing,
wherein the plurality of support bars are spaced apart from each other by a gap, and
wherein the heat radiating sheet includes a plurality of folding portions, and at least portions of the heat radiating sheet are located in spaces separating the plurality of support bars.

2. The electronic device of claim 1,
wherein the heat radiating sheet further includes a plurality of attachment portions attached with the plurality of support bars and the rear surface of the flexible display,
wherein the plurality of folding portions are disposed between the plurality of attachment portions adjacent to each other, and
wherein a partial section of the heat radiating sheet is formed in a film form in which the plurality of folding portions and the plurality of attachment portions are continuously connected.

3. The electronic device of claim 2, wherein the partial section of the heat radiating sheet is formed in a shape in which the plurality of attachment portions alternate with the plurality of folding portions in the sliding direction.

4. The electronic device of claim 2, wherein the plurality of folding portions extend from the plurality of attachment portions toward the spaces separating the plurality of support bars such that at least portions of the folding portions are located in the spaces separating the plurality of support bars.

5. The electronic device of claim 2, wherein the plurality of folding portions are not attached with the rear surface of the flexible display.

6. The electronic device of claim 2, further comprising:
a reinforcing sheet disposed between the heat radiating sheet and the flexible display,
wherein the reinforcing sheet includes a plurality of first portions attached to the plurality of attachment portions and a plurality of second portions disposed between the plurality of first portions and having a lattice pattern formed therein, and
wherein the plurality of second portions overlap the plurality of folding portions.

7. The electronic device of claim 2, wherein the plurality of folding portions are configured to be partially deformed in response to the sliding motion of the second housing.

8. The electronic device of claim 7, wherein the plurality of folding portions are formed in a pointed shape to have peaks located in higher positions than the plurality of attachment portions and are deformed in a form in which a distance between the peaks and the rear surface of the flexible display is increased or decreased depending on the sliding motion.

9. The electronic device of claim 1,
wherein each of the plurality of support bars includes a lower surface attached to the heat radiating sheet, an upper surface configured to face away from the lower surface, and a first side surface and a second side surface configured to connect the upper surface and the lower surface and face away from each other, and
wherein portions of the plurality of folding portions are accommodated in spaces between the first side surfaces and the second side surfaces of the plurality of support bars disposed adjacent to each other.

10. The electronic device of claim 9,
wherein each of the plurality of support bars is formed in a shape in which a length of the upper surface in the sliding direction is shorter than a length of the lower surface in the sliding direction and the first side surface and the second side surface extend from the upper surface and the lower surface so as to be rounded,
wherein when cross-sections of the plurality of support bars are viewed, first points and second points located at outermost positions on the first side surfaces and the second side surfaces are defined, and
wherein the plurality of folding portions are configured such that peaks of the plurality of folding portions are located at a same height as the first points and the second points or at a height lower than the first points and the second points.

11. The electronic device of claim 9,
wherein each of the plurality of support bars is formed such that the first side surface and the second side surface connect the upper surface and the lower surface in a flat form,
wherein when cross-sections of the plurality of support bars are viewed, a distance between the upper surface and the lower surface is defined as a height of the plurality of support bars, and
wherein the plurality of folding portions are configured such that peaks of the plurality of folding portions are located at a height lower than or equal to one half of the height of the plurality of support bars.

12. The electronic device of claim 1,
wherein the flexible display includes a base portion, a shape of which is maintained, the base portion being configured to form the front side of the electronic device and a rollable portion configured to extend from the base portion and configured such that at least a portion is deformed to be flat or curved in response to the sliding motion of the second housing,
wherein the heat radiating sheet includes a first portion attached to the rear surface of the base portion and a second portion attached to the rear surface of the rollable portion, and
wherein the plurality of folding portions are formed in the second portion.

13. The electronic device of claim 12,
wherein the first housing includes a bracket configured to support the base portion of the flexible display, and
wherein the bracket includes a first surface on which the first portion of the heat radiating sheet is disposed and a second surface on which a circuit board or a battery is supported, the second surface being configured to face away from the first surface.

14. The electronic device of claim 13, further comprising:

a heat generating component disposed on one surface of the circuit board; and a heat radiating structure configured to overlap at least a partial region of the first portion of the heat radiating sheet in a direction perpendicular to the one surface of the circuit board, wherein the heat radiating structure is disposed between the heat generating component and the bracket and is configured to diffuse heat generated from the heat generating component in a direction substantially perpendicular to the front side.

15. An electronic device comprising:

a housing having an opening formed on one side thereof;

a roller coupled to an inside of the housing so as to be rotatable; and a flexible display module connected to the roller at one end portion thereof and configured to be rolled around or unrolled from the roller depending on a direction of rotation of the roller, the flexible display module being configured to move into or out of the housing through the opening, wherein the flexible display module includes:

a flexible display, a heat radiating sheet disposed on at least a portion of a rear surface of the flexible display, and a flexible display support member disposed on at least a portion of a rear surface of the heat radiating sheet to support the flexible display, wherein the flexible display support member includes a plurality of support bars configured to extend in a direction substantially parallel to the roller, wherein the plurality of support bars are spaced apart from each other by a gap, wherein the heat radiating sheet includes a plurality of attachment portions to which the plurality of support bars and the rear surface of the flexible display are attached and a plurality of folding portions disposed between the plurality of attachment portions adjacent to each other, and wherein the plurality of folding portions are configured such that at least portions thereof are located in spaces separating the plurality of support bars.

16. The electronic device of claim 15, wherein the heat radiating sheet is formed in a shape in which the plurality of attachment portions alternate with the plurality of folding portions.

17. The electronic device of claim 15, wherein the plurality of folding portions extend from the plurality of attachment portions toward the spaces separating the plurality of support bars such that the at least the portions thereof are located in the spaces separating the plurality of support bars.

18. The electronic device of claim 15, wherein the plurality of folding portions are not attached with the rear surface of the flexible display.

19. The electronic device of claim 15, wherein the flexible display module further includes a reinforcing sheet disposed between the heat radiating sheet and the flexible display, wherein the reinforcing sheet includes a plurality of first portions attached to the plurality of attachment portions and a plurality of second portions disposed between the plurality of first portions and having a lattice pattern formed therein, and wherein the plurality of second portions overlap the plurality of folding portions.

20. The electronic device of claim 15, wherein the plurality of folding portions are formed in a pointed shape to have peaks located in higher positions than the plurality of attachment portions and are deformed in a form in which a distance between the peaks and the rear surface of the flexible display is increased or decreased depending on an operation in which the flexible display module is rolled around or unrolled from the roller.

* * * * *